(12) United States Patent
Kim

(10) Patent No.: US 9,263,101 B2
(45) Date of Patent: Feb. 16, 2016

(54) SEMICONDUCTOR MEMORY DEVICE

(71) Applicant: SK hynix Inc., Gyeonggi-do (KR)

(72) Inventor: Kwan-Weon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/522,345

(22) Filed: Oct. 23, 2014

(65) Prior Publication Data

US 2015/0269980 A1    Sep. 24, 2015

(30) Foreign Application Priority Data

Mar. 21, 2014  (KR) .................. 10-2014-0033272

(51) Int. Cl.
| | | |
|---|---|---|
| *G11C 7/00* | (2006.01) | |
| *G11C 7/22* | (2006.01) | |
| *G11C 5/14* | (2006.01) | |
| *G11C 8/00* | (2006.01) | |
| *G11C 7/10* | (2006.01) | |

(52) U.S. Cl.
CPC ... *G11C 7/10* (2013.01); *G11C 7/22* (2013.01)

(58) Field of Classification Search
USPC ................ 365/189.011, 189.15, 189.16, 226, 365/230.03, 233.1
See application file for complete search history.

(56) References Cited

U.S. PATENT DOCUMENTS

| | | | | | |
|---|---|---|---|---|---|
| 5,848,004 | A | * | 12/1998 | Dosaka ............... | G11C 7/1018 365/230.03 |
| 6,988,170 | B2 | * | 1/2006 | Barroso ............. | G06F 12/0826 365/230.03 |
| 7,619,935 | B2 | * | 11/2009 | Kim ..................... | G11C 7/1051 365/189.15 |
| 7,911,825 | B2 | * | 3/2011 | Matsuzaki ......... | G06F 13/1605 365/230.03 |
| 8,072,821 | B2 | * | 12/2011 | Arai .................... | G11C 7/1006 365/189.011 |
| 8,687,456 | B2 | * | 4/2014 | Sato ................... | G06F 13/1605 365/230.03 |

FOREIGN PATENT DOCUMENTS

KR      1020120110157     10/2012

* cited by examiner

*Primary Examiner* — Trong Phan
(74) *Attorney, Agent, or Firm* — IP & T Group LLP

(57) ABSTRACT

A semiconductor memory device includes first and second memory regions configured to store data in a mirrored fashion with respect to each other during a high speed operation period; and a read operation block configured to repeatedly and alternately select the first and second memory regions and read data from a selected memory region, in the case where the first or second memory region is repeatedly selected n read operations of at least two times during the high speed operation period.

20 Claims, 14 Drawing Sheets

SEMICONDUCTOR MEMORY DEVICE

CROSS-REFERENCE TO RELATED APPLICATIONS

The present application claims priority of Korean Patent Application No. 10-2014-0033272, filed on Mar. 21, 2014, which is incorporated herein by reference in its entirety.

BACKGROUND

1. Field

Exemplary embodiments of the present invention relate to a semiconductor design technology and, more particularly, to a semiconductor memory device which supports high speed operations.

2. Description of the Related Art

In general, semiconductor memory devices perform read data operations on a basic cycle. That is to say, reading data in a semiconductor memory device cell array includes stepwise operations such as active (ACT), read (READ) and precharge (PCG) operations, as shown in FIG. 1. "CLK", "Command", "RD", "Address", "Bank A ADD(X,Y)" and "Internal operation" shown in FIG. 1 denote "a clock signal", "a command signal", "a read command signal", "an address signal", "row and column addresses of bank A" and "an internal operation sequence", respectively. A minimum time tRC is required to perform such stepwise active (ACT), read (READ) and precharge (PCG) operations between successive read operations. The time required between successive operations is determined in part by the physical characteristics of the circuit, including the time that it takes for circuits and capacitors to reach equilibrium after being charged and discharged. This is one limitation on the ability of memory cells to perform read and write operations.

Semiconductor memory device operating speed, including the ability to output data quickly, has been and still is an important design factor. Therefore, the semiconductor industry is constantly looking for ways to improve the speed with which memory cells can be read and be written to.

Conventional semiconductor memory devices have internally divided cell arrays including a plurality of banks that output data independently in order to increase operating speeds. The banks may output data at intervals shorter than 'tRC' in such a manner that their operation periods overlap. Therefore, data may be successively outputted within a time shorter than 'tRC'.

However, although a large number of banks are included in a semiconductor memory device, a minimum time tRC is needed between operations for repeatedly accessing and reading data from the same bank.

SUMMARY

Various embodiments are directed to a semiconductor memory device which may output data at high speed even when reading data by successively accessing the same memory region.

In an embodiment, a semiconductor memory device may include first and second memory regions suitable for storing data in a mirrored fashion (i.e. the data in the first and second memory regions are identical copies, or duplicates) during a high speed operation period, and a read operation block suitable for alternately selecting the first and second memory regions and reading data from a selected memory region, when the first or second memory region is repeatedly selected in read operations performed two or more times during the high speed operation period.

In an embodiment, a semiconductor memory device may include a first storage block including a first memory region and a second memory region which stores mirrored data from the first memory region (i.e. a copy of the data from the first memory region is stored in the second memory region), a second storage block including a third memory region and a fourth memory region which store in which stores mirrored data from the third memory region, and a read operation block suitable for alternately selecting select the first and second memory regions when the first storage block is repeatedly selected in read operations performed two or more times, alternately selecting the third and fourth memory regions when the second storage block is repeatedly selected in the read operations performed two or more times, and reading data from a selected memory region.

In an embodiment, a semiconductor memory device may include first and second memory regions suitable for storing respective data, a write operation block suitable for storing duplicate data in the first memory region and the second memory region at the same position therein during a high speed operation period, and a read operation block suitable for alternately reading the duplicate data from the first and second memory regions during the high speed operation period.

DETAILED DESCRIPTION

Figure 1:
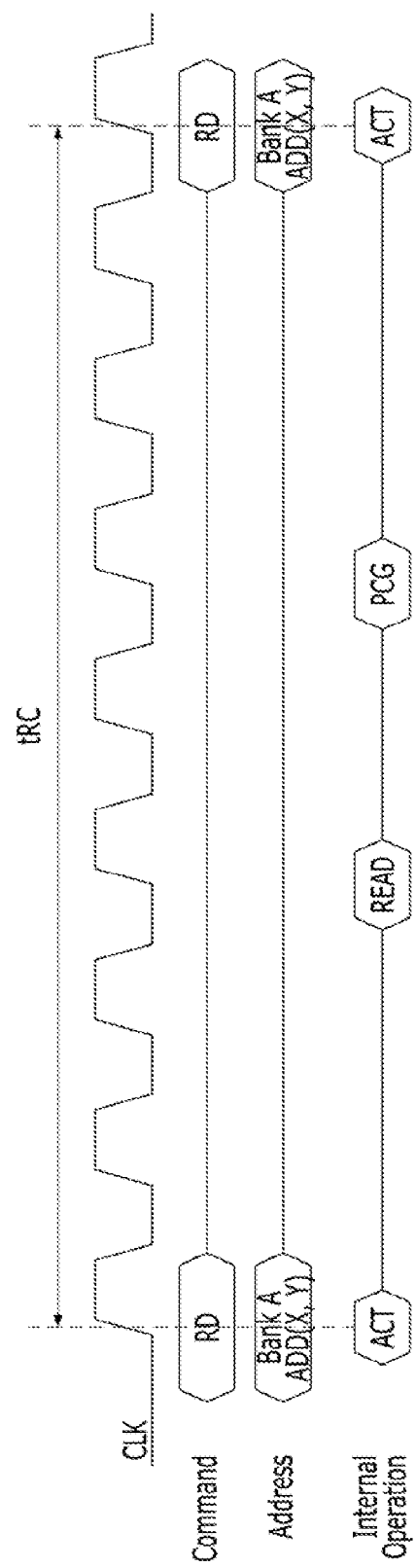
FIG. 1 is a diagram explaining the concept of tRC'.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments.

Figure 2A:
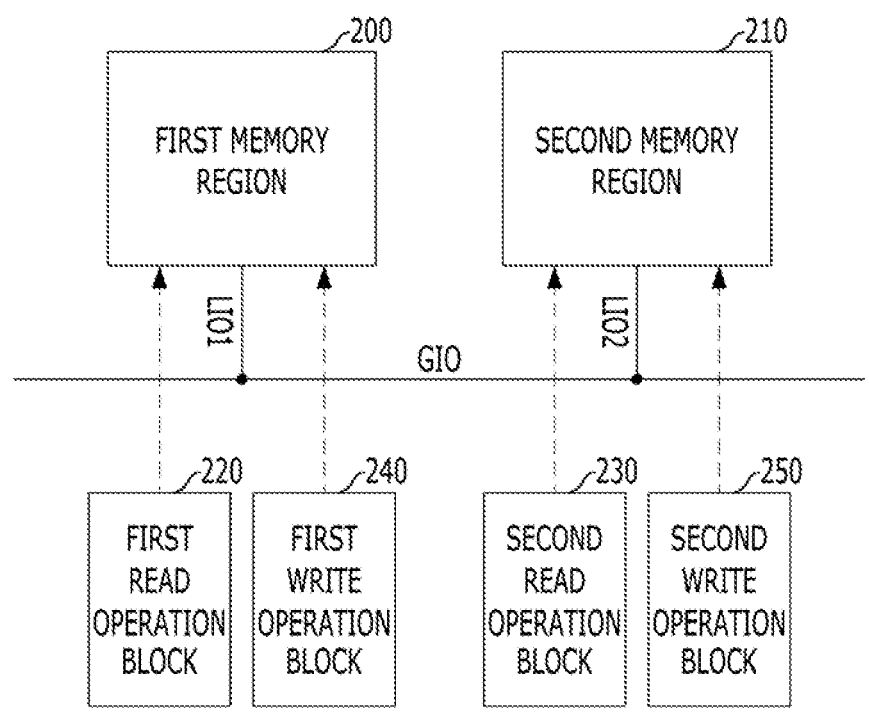
FIG. 2A is a diagram explaining the concept of read/write operations of a general semiconductor memory device.

FIG. 2A is a diagram explaining the concept of read/write operations of a general semiconductor memory device.

Referring to FIG. 2A, the general semiconductor memory device includes a first memory region 200, a second memory region 210, a first read operation block 220, a second read operation block 230, a first write operation block 240, and a second write operation block 250.

A plurality of cells (not shown) is disposed in an array in the first memory region 200. A plurality of cells (not shown) is disposed in an array in the second memory region 210.

The first read operation block 220 controls the data output operation of the first memory region 200. The first write operation block 240 controls the data input operation of the first memory region 200.

The second read operation block 230 controls the data output operation of the second memory region 210. The second write operation block 250 controls the data input operation of the second memory region 210.

As in the above configuration, the first memory region 200 is controlled in its operation by the first read operation block 220 and the first write operation block 240, and the second memory region 210 is controlled in its operation by the second read operation block 230 and the second write operation block 250. Accordingly, the first memory region 200 and the second memory region 210 may input/output data completely independent of each other. To this end, the first memory region 200 inputs/outputs data through a first local line LIO1 and the second memory region 210 inputs/outputs data through a second local line LIO2.

Of course, it is not that the first memory region 200 and the second memory region 210 operate completely in parallel and input/output data through different paths. Rather, it is only possible for the first memory region 200 and the second memory region 210 to operate at an interval shorter than 'tRC' in such a way that their operation periods overlap with each other. That is to say, the data of the first memory region 200 may be inputted/outputted from and to the exterior only through a global line GIO along with the first local line LIO1. Similarly, the data of the second memory region 210 may be inputted/outputted from and to the exterior only through the global line GIO along with the second local line LIO2. The first local line LIO1 and the second local line LIO2 use the global line GIO in common.

Summarizing, in the general semiconductor memory device, the space for storing data is divided into the first memory region 200 and the second memory region 210, and data is independently inputted/outputted from and to the first local line LIO1 and the second local line LIO2. Further, the first local line LIO1 and the second local line LIO2 input/output data through a shared global line GIO in a time division scheme.

Accordingly, in the general semiconductor memory device, when the first memory region 200 and the second memory region 210 successively operate, they may output data at an interval shorter than 'tRC' in a state in which their operation periods overlap with each other.

However, when only the first memory region 200 repetitively and successively operates or only the second memory region 210 repetitively and successively operates, data may be outputted at an interval of 'tRC'.

For reference, while it is shown in the drawing that only two memory regions 200 and 210 are present in the semiconductor memory device, this is merely an example and an increased number of memory regions may be included.

Figure 2B:
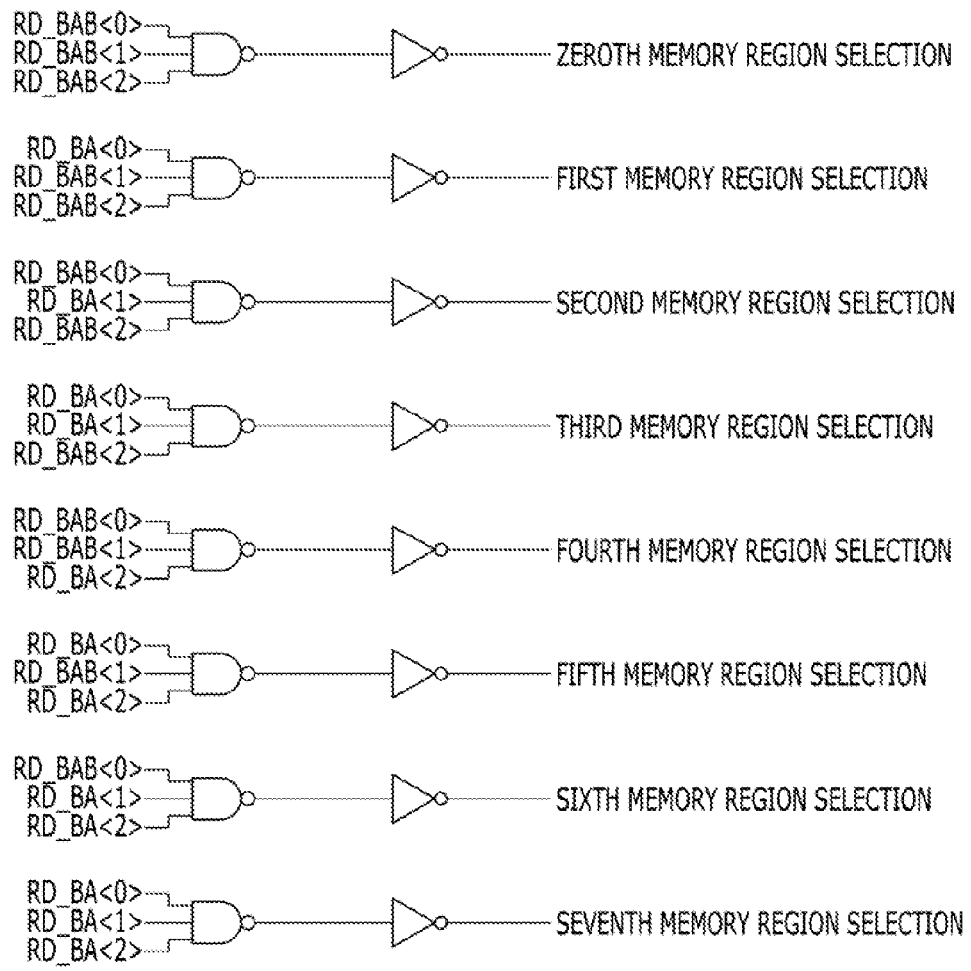
FIG. 2B is a diagram explaining a scheme of selecting any one memory region among a plurality of memory regions in the general semiconductor memory device shown in FIG. 2A.

FIG. 2B is a diagram explaining a scheme of selecting any one memory region among a plurality of memory regions in the general semiconductor memory device shown in FIG. 2A.

Referring to FIG. 2B, it may be seen that a method of divisionally using region selection addresses RD_BA<0:2> is employed to select and operate any one memory region when two or more memory regions are included in a general semiconductor memory device.

For example, as shown in FIG. 2B, by combining three region selection addresses RD_BA<0:2>, any one memory region may be selected and operated among a maximum of eight memory regions Zeroth Memory Region Selection, First Memory Region Selection, Second Memory Region Selection, Third Memory Region Selection, Fourth Memory Region Selection, Fifth Memory Region Selection, Sixth Memory Region Selection and Seventh Memory Region Selection.

Although a plurality of memory regions are included in a general semiconductor memory device, as shown in FIG. 2B, only one memory region may be selected and operated at a time. Hence, the same memory region may be successively selected at any time and in this case data may be outputted at an interval of 'tRC'.

First Embodiment

Figure 3:
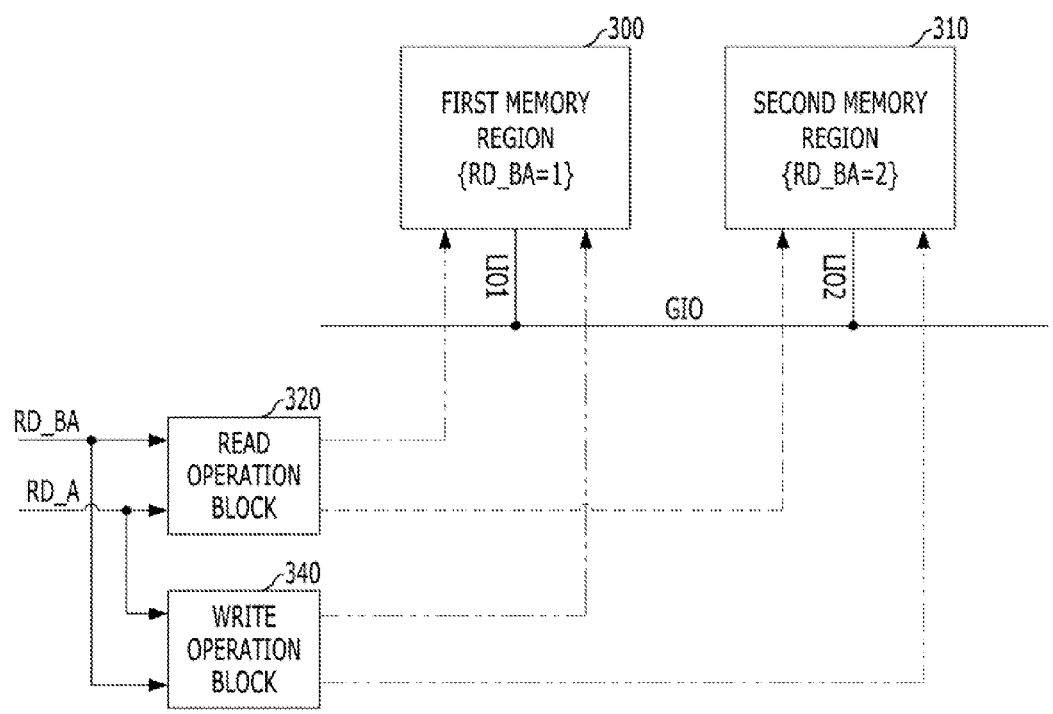
FIG. 3 is a diagram explaining the concept of read/write operations of a semiconductor memory device in accordance with a first embodiment of the present disclosure.

FIG. 3 is a diagram explaining the concept of read/write operations of a semiconductor memory device in accordance with a first embodiment of the present disclosure.

Referring to FIG. 3, the semiconductor memory device in accordance with the first embodiment of the present disclosure includes a first memory region 300, a second memory region 310, a read operation block 320, and a write operation block 340.

A plurality of cells (not shown) is disposed in an array in the first memory region 300. A plurality of cells (not shown) is disposed in an array in the second memory region 310. The data stored in the second memory region 310 are generated by copying the data stored in the first memory region 300 in a mirrored fashion (i.e. the data is duplicated or copied).

That is to say, the plurality of cells disposed in the first memory region 300 are the same as those of the second memory region 310 in terms of type and size. Therefore, the first memory region 300 and the second memory region 310 are different in terms of only an address RD_BA for selecting a memory region and are completely the same in terms of the address RD_A for accessing a cell disposed therein. For example, when addresses RD_BA and RD_A for selecting the cell disposed on the third word line and the seventh bit line of the first memory region 300 are composed as RD_BA=1 and RD_A=3 7, addresses RD_BA and RD_A for selecting the cell disposed on the third word line and the seventh bit line of the second memory region 310 will be composed as RD_BA=2 and RD_A=3 7. In this way, the first memory region 300 and the second memory region 310 are set in such a manner that data with the same values are stored in respective cells at the same position therein.

A plurality of other memory regions which are not shown in the drawing may be provided in the semiconductor memory device in addition to the first memory region 300 and the second memory region 310, and in this case, the plurality of cells disposed in the other memory regions may be the same as those in the first and second memory regions 300 and 310 in terms of type and size. In other words, not only the first memory region 300 and the second memory region 310 but also the other memory regions, which are included in the semiconductor memory device, may be set in such a manner that they are different in terms of only an address RD_BA for selecting a memory region but are completely the same in terms of the address RD_A for accessing the cells disposed therein. Thus, the addresses RD_BA and RD_A inputted to the semiconductor memory device may be divided into a region selection address RD_BA for selecting a memory region and a cell selection address RD_A for selecting a unit cell which is included in each memory region.

When one memory region of the first memory region 300 and the second memory region 310 is repeatedly selected when a read operation is performed two or more times, the read operation block 320 alternately selects the first memory region 300 and the second memory region 310 and reads data from a selected memory region 300 or 310. Namely, when the value of the region selection address RD_BA between input addresses RD_BA and RD_A indicates any one memory region of the first memory region 300 and the second memory region 310 when a read operation is performed two or more times, the read operation block 320 alternately selects the first memory region 300 and the second memory region 310 and reads data from a selected memory region 300 or 310.

For example, when a read operation is performed three times, the region selection address RD_BA which indicates the first memory region 300 may be inputted in all first to third read operations. In such a read operation performed three times, the read operation block 320 selects the first memory region 300 in correspondence to the first read operation, and selects and reads the data stored therein, based on the value of the cell selection address RD_A. Then, the read operation block 320 selects the second memory region 310 in correspondence to the second read operation, and selects and reads the data stored therein, based on the value of the cell selection address RD_A. After that, the read operation block 320 again selects the first memory region 300 in correspondence to the third read operation, and selects and reads the data stored therein, based on the value of the cell selection address RD_A.

For another example, when a read operation is performed four times, the region selection address RD_BA which indicates the first memory region 300 may be inputted in first and fourth read operations, while the region selection address RD_BA which indicates the second memory region 310 is inputted in second and third read operations. In such a read operation performed four times, the read operation block 320 selects the first memory region 300 in correspondence to the first read operation, and selects and reads the data stored therein, based on the value of the cell selection address RD_A. Next, the read operation block 320 selects the second memory region 310 in correspondence to the second read operation, and selects and reads the data stored therein, based on the value of the cell selection address RD_A. Then, the read operation block 320 selects again the first memory region 300 in correspondence to the third read operation, and selects and reads the data stored therein, based on the value of the cell selection address RD_A. After that, the read operation block 320 selects again the second memory region 310 in correspondence to the fourth read operation, and selects and reads the data stored therein, based on the value of the cell selection address RD_A.

In this way, when the region selection address RD_BA for selecting the first memory region 300 or the second memory region 310 is inputted when a read operation is performed two or more times, the read operation block 320 alternately selects the first memory region 300 and the second memory region 310 regardless of the value of the region selection address RD_BA, and selects and reads the data stored in a selected memory region, based on the value of the cell selection address RD_A. The reason why such an operation is possible is that the first memory region 300 and the second memory region 310 store data in a mirrored fashion with respect to each other.

When any one memory region of the first memory region 300 and the second memory region 310 is selected in a write operation, the write operation block 340 duplicately stores input data in the first memory region 300 and the second memory region 310. That is to say, the write operation block 340 operates in the write operation in such a manner that input data may be stored in the first memory region 300 and the second memory region 310 in a mirrored fashion.

As may be readily seen from the above descriptions, the operations of the first memory region 300 and the second memory region 310 are controlled in common by the read operation block 320 and the write operation block 340. Of course, the first memory region 300 and the second memory region 310 may input/output data completely independent of each other as usual. In other words, the first memory region 300 inputs/outputs data through a first local line LIO1. Also, the second memory region 310 inputs/outputs data through a second local line LIO2. The first local line LIO1 and the second local line LIO2 use a global line GIO in common. Accordingly, the data of the first memory region 300 is inputted/outputted from and to the exterior through the global line GIO along with the first local line LIO1. Similarly, the data of the second memory region 310 is inputted/outputted from and to the exterior through the global line GIO along with the second local line LIO2.

The above described configuration of the semiconductor memory device wherein the operations of the first memory region 300 and the second memory region 310 are controlled in common may be adopted only in a specified mode. For example, in a high speed operation mode, as described above in the present embodiment, the operations of the first memory region 300 and the second memory region 310 are controlled in common, and data is stored in a mirrored fashion with respect to each other. However, in a normal operation mode other than the high speed operation mode, as shown in FIG. 2A, the first memory region 300 and the second memory region 310 are controlled completely independent of each other, and data stored in each of the regions is not related. Namely, in the normal operation mode, the read operation block 320 reads data stored in a memory region selected in a read operation. The read operation block 320 reads the data stored in the first memory region 300 when the first memory region 300 is selected in a read operation and reads the data stored in the second memory region 310 when the second memory region 310 is selected in a read operation. Similarly, in the normal operation mode, the write operation block 340 stores input data in a memory region selected in a write operation. The write operation block 340 stores input data in the first memory region 300 when the first memory region 300 is selected in a write operation and stores input data in the second memory region 310 when the second memory region 310 is selected in a write operation.

Figure 4:
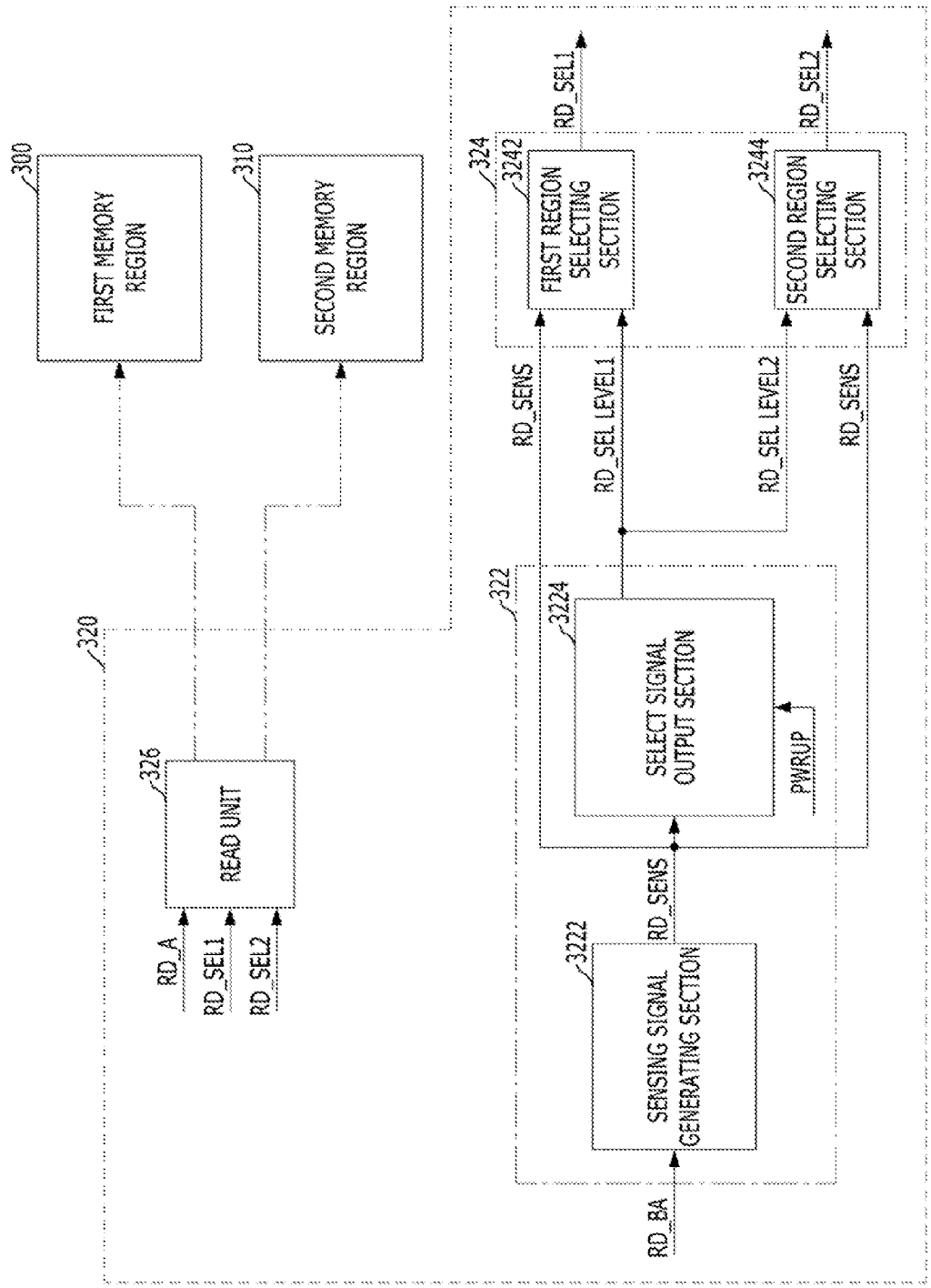
FIG. 4 is a diagram showing in detail a read operation block among the component elements of the semiconductor memory device in accordance with the first embodiment of the present disclosure shown in FIG. 3.

FIG. 4 is a diagram showing in detail the read operation block among the component elements of the semiconductor memory device in accordance with the first embodiment of the present disclosure shown in FIG. 3.

Referring to FIG. 4, the read operation block 320 among the component elements of the semiconductor memory device in accordance with the first embodiment of the present disclosure includes an address sensing unit 322, a selection unit 324, and a read unit 326. The address sensing unit 322 includes a sensing signal generating section 3222, and a select signal output section 3224. Further, the selection unit 324 includes a first region selecting section 3242 and a second region selecting section 3244.

The address sensing unit 322 shifts the logic level of a select signal RD_SEL each time it is sensed that the region selection address RD_BA indicates any one memory region of the first memory region 300 and the second memory region 310 in the read operation.

The sensing signal generating section 3222 toggles/pulses a sensing signal RD_SENS each time it is sensed that the region selection address RD_BA indicates the first memory region 300 or the second memory region 310 in the read operation.

The select signal output section 3224 initializes the select signal RD_SEL to a first logic level LEVEL1 in response to a power-up signal PWRUP. Also, after the initialization, the select signal output section 3224 shifts the select signal RD_SEL to a second logic level LEVEL2 in response to odd-numbered toggling of the sensing signal RD_SENS. Further, after the initialization, the select signal output section 3224 shifts the select signal RD_SEL to the first logic level LEVEL1 in response to even-numbered toggling of the sensing signal RD_SENS.

The selection unit 324 selects the first memory region 300 in the first logic level period of the select signal RD_SEL, and selects the second memory region 310 in the second logic level period of the select signal RD_SEL.

The first region selecting section 3242 toggles a first select signal RD_SEL1 for selecting the first memory region 300 in response to the toggling of the sensing signal RD_SENS in the first logic level period of the select signal RD_SEL.

The second region selecting section 3244 toggles a second select signal RD_SEL2 for selecting the second memory region 310, in response to the toggling of the sensing signal RD_SENS in the second logic level period of the select signal RD_SEL.

The read unit 326 reads the data stored in a memory cell which is designated by the cell selection address RD_A, among the plurality of memory cells (not shown) included in the memory region 300 or 310 selected by the selection unit 324.

In detail, the read unit 326 reads the data stored in a memory cell which is designated by the cell selection address RD_A, among the plurality of memory cells (not shown) included in the first memory region 300, in response to the toggling of the first select signal RD_SEL1. Also, the read unit 326 reads the data stored in a memory cell which is designated by the cell selection address RD_A, among the plurality of memory cells (not shown) included in the second memory region 310, in response to the toggling of the second select signal RD_SEL2.

Figure 5:
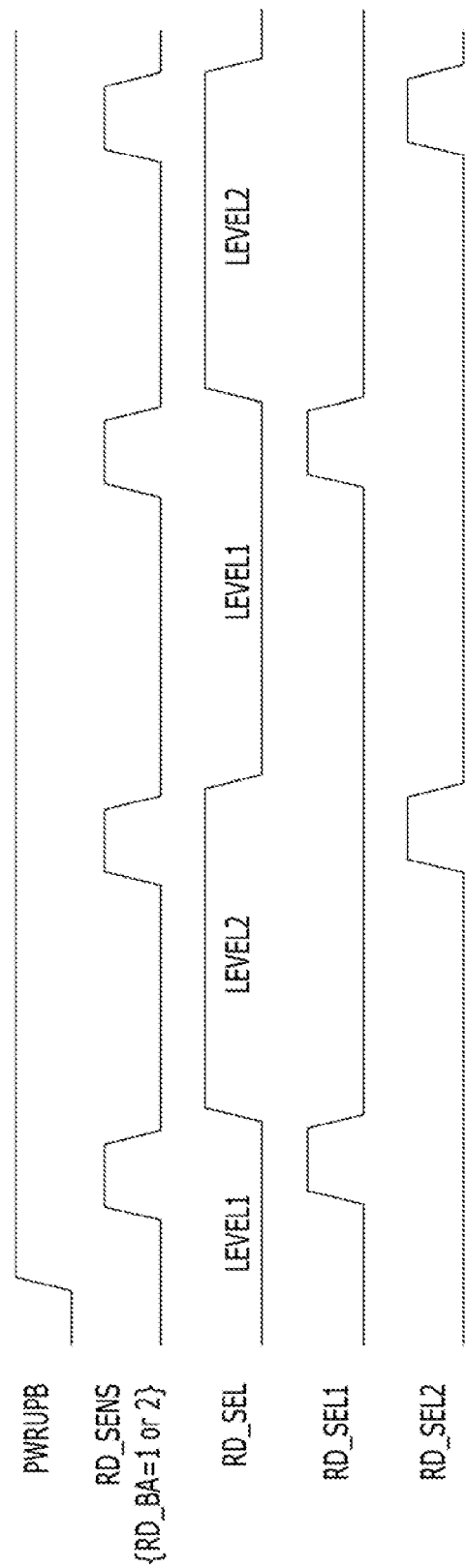
FIG. 5 is a timing diagram explaining the operation of the read operation block in accordance with the first embodiment of the present disclosure shown in FIG. 4.

FIG. 5 is a timing diagram explaining the operation of the read operation block in accordance with the first embodiment of the present disclosure shown in FIG. 4.

Referring to FIG. 5, the operation of the read operation block 320 in accordance with the first embodiment of the present disclosure is started as the select signal RD_SEL is set to the first logic level LEVEL1 in response to the power-up signal PWRUP. That is to say, the operation of the read operation block 320 is started as the select signal RD_SEL is set to the first logic level LEVEL1 in response to a signal PWRUPB that is generated by inverting the phase of the power-up signal PWRUP and transitions from a logic low to a logic high.

After the initial operation, if it is sensed that the region selection address RD_BA among the addresses (not shown) inputted from the exterior has the value of '1' designating the first memory region 300 or the value of '2' designating the second memory region 310, the sensing signal RD_SENS toggles. For example, as in the drawing, each time the region selection address RD_BA has the value of '1' or '2', the sensing signal RD_SENS toggles to a logic high in the state in which the logic level of the sensing signal RD_SENS is basically set to a logic low.

After the select signal RD_SEL is initialized to the first logic level LEVEL1 by the power-up signal PWRUP, the select signal RD_SEL transitions to the second logic level LEVEL2 in response to the sensing signal RD_SENS toggling first. Then, the select signal RD_SEL transitions again to the first logic level LEVEL1 in response to the sensing signal RD_SENS toggling second. After that, the select signal RD_SEL transitions again to the second logic level LEVEL2 in response to the sensing signal RD_SENS toggling third. In this way, after being initialized to the first logic level LEVEL1, the select signal RD_SEL repeatedly transitions between the second logic level LEVEL2 and the first logic level LEVEL1 each time the sensing signal RD_SENS toggles.

For reference, while it may be seen in the drawing that the first logic level LEVEL1 means a logic low and the second logic level LEVEL2 means a logic high, this is only an example and the opposite is possible.

Meanwhile, the transition time of the select signal RD_SEL is set to correspond to a time when the toggling of the sensing signal RD_SENS is completed. In other words, the select signal RD_SEL retains a previous logic level at a time when the toggling of the sensing signal RD_SENS starts and transitions in response to the completion of the toggling. This is to ensure that the toggling of the sensing signal RD_S-ENS is transferred thoroughly to the toggling of the first select signal RD_SEL1 or the toggling of the second select signal RD_SEL2.

Therefore, after the select signal RD_SEL is initialized to the first logic level LEVEL1 by the power-up signal PWRUP, the sensing signal RD_SENS makes the first toggling in the state in which the select signal RD_SEL has thoroughly transferred the first logic level LEVEL1'. In this way, due to the fact that the first toggling of the sensing signal RD_SENS is implemented in the state in which the select signal RD_SEL has the first logic level LEVEL1, the first select signal RD_SEL1 toggles, but the second select signal RD_SEL2 does not toggle. Namely, the first memory region 300 is selected, and the data stored therein is selectively read based on the value of the cell selection address RD_A. However, the second memory region 310 is not selected, and the data stored therein is not read regardless of the cell selection address RD_A.

Similarly, after the select signal RD_SEL transitions to the second logic level LEVEL2 by the first toggling of the sensing signal RD_SENS, the sensing signal RD_SENS makes the second toggling in the state in which the select signal RD_SEL has thoroughly transferred the second logic level LEVEL2. In this way, due to the fact that the second toggling of the sensing signal RD_SENS is implemented in the state in which the select signal RD_SEL has the second logic level LEVEL2, the second select signal RD_SEL2 toggles, but the first select signal RD_SEL1 does not toggle. Namely, the second memory region 310 is selected, and the data stored therein is selectively read based on the value of the cell selection address RD_A. However, the first memory region 300 is not selected, and the data stored therein is not read regardless of the cell selection address RD_A.

This applies the same to the third toggling and the fourth toggling of the sensing signal RD_SENS. Thus, the third toggling of the sensing signal RD_SENS is implemented in the state in which the select signal RD_SEL has thoroughly transferred the first logic level LEVEL1, and the fourth toggling of the sensing signal RD_SENS is implemented in the state in which the select signal RD_SEL has thoroughly transferred the second logic level LEVEL2. Accordingly, the first select signal RD_SEL1 toggles in response to the third toggling of the sensing signal RD_SENS, and the first memory region 300 is selected and the data stored therein is read. Also, the second select signal RD_SEL2 toggles in response to the fourth toggling of the sensing signal RD_SENS, and the second memory region 310 is selected and the data stored therein is read.

Summarizing this, after the initialization, the first select signal RD_SEL1 toggles in response to the odd-numbered toggling of the sensing signal RD_SENS, and the first memory region 300 is selected and the data stored therein is read. Conversely, after the initialization, the second select signal RD_SEL2 toggles in response to the even-numbered toggling of the sensing signal RD_SENS, and the second memory region 310 is selected and the data stored therein is read.

Figure 6:
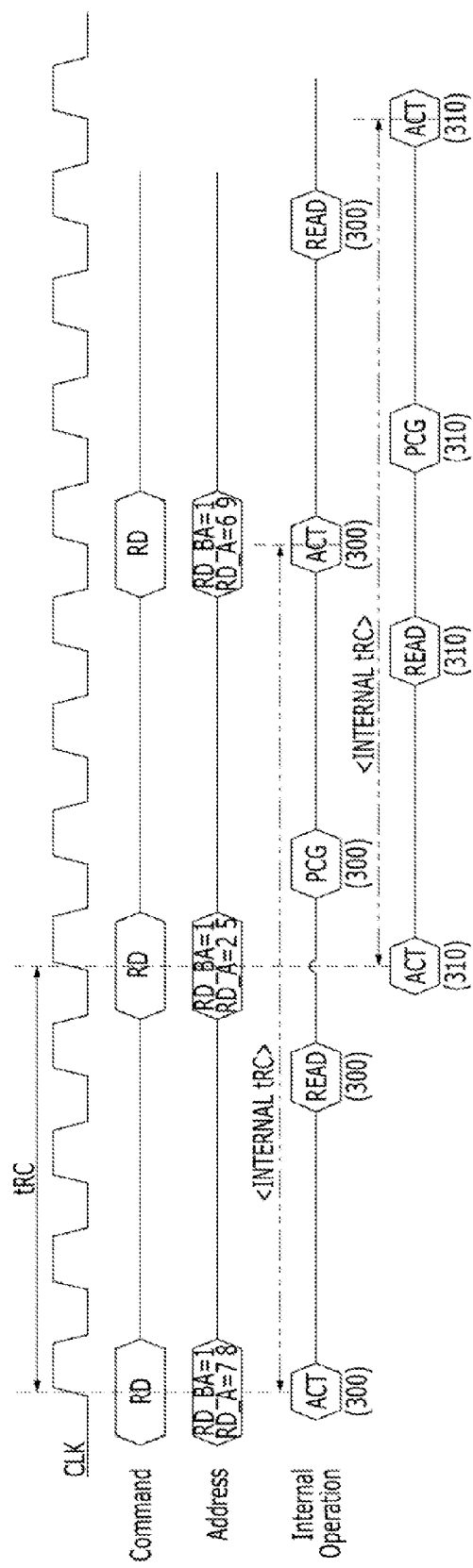
FIG. 6 is a timing diagram explaining a read operation of the semiconductor memory device in accordance with the first embodiment of the present disclosure shown in FIGS. 3 to 5.

FIG. 6 is a timing diagram explaining a read operation of the semiconductor memory device in accordance with the first embodiment of the present disclosure shown in FIGS. 3 to 5.

Referring to FIG. 6, it may be seen that, in the semiconductor memory device in accordance with the first embodiment of the present disclosure, a minimum time tRC required between successive read operations is shortened to ½ when compared to the conventional semiconductor memory device shown in FIG. 1. "Command", "RD", "Address", and "Internal operation" shown in FIG. 6 denote "a command signal", "a read command signal", "an address signal", and "an internal operation sequence", respectively.

When exemplarily describing this in detail, it may be seen from the drawing that, when a read operation is successively repeated three times, the respective read operations are successively performed at the interval of 4 cycles (4 ck) of a clock signal CLK. It may be seen that, when considering that 8 cycles (8 ck) of the clock signal CLK is required between the successive read operations in the conventional semiconductor memory device shown in FIG. 1, the interval of 4 cycles (4 ck) of the clock signal CLK corresponds to one half.

In particular, in the input addresses RD_BA and RD_A corresponding to the first read operation, the region selection address RD_BA has the value of '1' and the cell selection address RD_A has the value of '7 8'. In the input addresses RD_BA and RD_A corresponding to the second read operation, the region selection address RD_BA has the value of '1' and the cell selection address RD_A has the value of '2 5'. In the input addresses RD_BA and RD_A corresponding to the third read operation, the region selection address RD_BA has the value of '1' and the cell selection address RD_A has the value of '6 9'. In this way, the input addresses RD_BA and RD_A in all the three read operations have the region selection address RD_BA with the value of '1'. That is to say, in the same manner in all the three read operations, the region selection address RD_BA is inputted to select the first memory region 300. Therefore, the three read operations are to be successively performed for only the first memory region 300 at the interval of 4 cycles (4 ck) of the clock signal CLK. In this regard, in the conventional semiconductor memory device shown in FIG. 1, since a physical limitation exists in that the minimum time tRC corresponds to 8 cycles (8 ck) of the clock signal CLK, the three successive read operations as shown in FIG. 6 may not be properly performed.

However, in the semiconductor memory device in accordance with the first embodiment of the present disclosure, the data stored in the first memory region 300 is stored in the second memory region 310 in a mirrored fashion, and the first memory region 300 and the second memory region 310 are alternately selected internally, regardless of the region selection address RD_BA that is inputted to select the first memory region 300 in the same manner in all the three read operations. Therefore, in the semiconductor memory device in accordance with the first embodiment of the present disclosure, the successive three read operations as shown in FIG. 6 may be properly performed, while each of the first and second memory regions 300 and 310 is provided with a read operation time INTERNAL tRC for the basic cycle of the read operation, which may correspond to 8 cycles (8 ck) of the clock signal CLK.

Summarizing this, in the semiconductor memory device in accordance with the first embodiment of the present disclosure, in the case where the same memory region is repeatedly selected in a read operation which is performed two or more times, the memory region may be selected alternately with other memory regions storing the same data as the memory region. Hence, in FIG. 6, although the region selection address RD_BA is inputted to select the first memory region 300 in all the three read operations which are repeatedly performed, the first memory region 300 is selected in the first and third read operations and the second memory region 310 is selected in the second read operation. Therefore, the read operation time corresponding to 8 cycles (8 ck) of the clock signal CLK is ensured for each of the read operations.

In other words, in the first read operation which is performed in the first memory region 300, the cell disposed on the seventh word line and the eighth bit line in the first memory region 300 is selected and the data stored therein is read through the stepwise operations of active (ACT), read (READ) and precharge (PCG) for the read operation time corresponding to 8 cycles (8 ck) of the clock signal CLK. Thus, the first read operation may be performed without a problem.

Further, in the second read operation which is performed in the second memory region 310, the cell disposed on the second word line and the fifth bit line in the second memory region 310 is selected and the data stored therein is read through the stepwise operations of active (ACT), read (READ) and precharge (PCG) for the read operation time corresponding to 8 cycles (8 ck) of the clock signal CLK. Thus, the second read operation may be performed with no problem.

The operation periods of the first read operation and the second read operation overlap with each other. In spite of this fact, the reason why the first read operation and the second read operation may be performed without a problem resides in that the first read operation is an operation to be performed in the first memory region 300 and the second read operation is an operation to be performed in the second memory region 310.

Moreover, in the third read operation, which is performed in the first memory region 300, the cell disposed on the sixth word line and the ninth bit line in the first memory region 300 is selected and the data stored therein is read through the stepwise operations of active (ACT), read (READ) and precharge (PCG) for the read operation time corresponding to 8 cycles (8 ck) of the clock signal CLK.

The operation periods of the second read operation and the third read operation overlap with each other. In spite of this fact, the reason why the second read operation and the third read operation may be performed without problem resides in that the second read operation is an operation to be performed in the second memory region 310 and the third read operation is an operation to be performed in the first memory region 300.

On the other hand, the read operations may be performed at the time interval corresponding to the read operation in the one memory region. That is, the first and third read operations are performed at the time interval corresponding to 8 cycles (8 ck) of the clock signal CLK.

In this way, in the semiconductor memory device to which the first embodiment of the present disclosure is applied, the data of the first memory region 300 is stored in the second memory region 310 in a mirrored fashion. Therefore, in the case of an operation for repeatedly accessing the first memory region 300 and reading data therefrom or an operation for repeatedly accessing the second memory region 310 and reading data therefrom, the read operation may be properly performed in such a way that the semiconductor memory device alternately selects the first memory region 300 and the second memory region 310. Through this, even in the case where an operation for reading data in the first memory region 300 is repeated at a high speed or an operation for reading data in the second memory region 310 is repeated at a high speed, the read operation may be properly performed without a problem.

Second Embodiment

Figure 7:
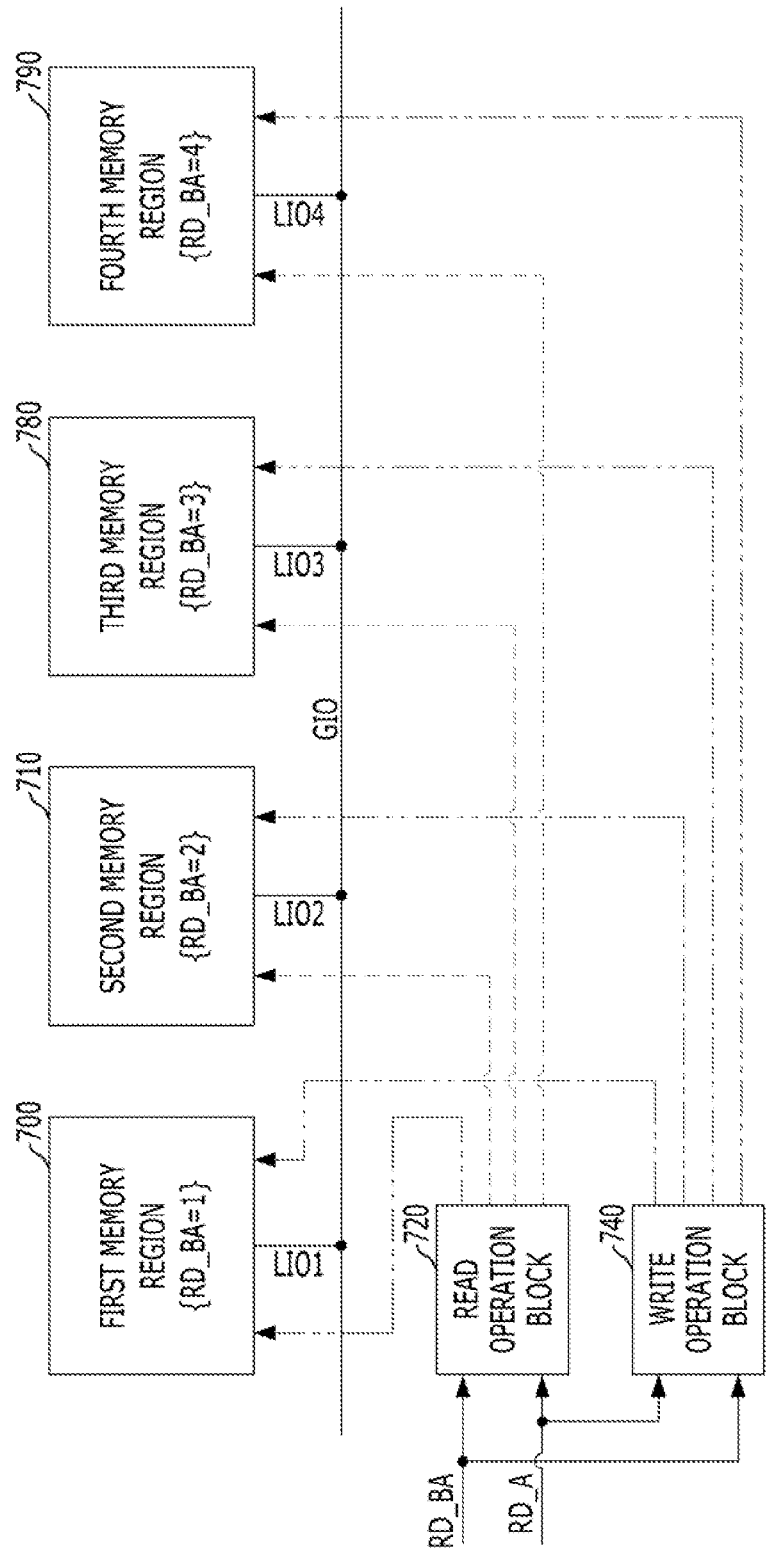
FIG. 7 is a diagram explaining the concept of read/write operations of a semiconductor memory device in accordance with a second embodiment of the present disclosure.

FIG. 7 is a diagram explaining the concept of read/write operations of a semiconductor memory device in accordance with a second embodiment of the present disclosure.

Referring to FIG. 7, the semiconductor memory device in accordance with the second embodiment of the present disclosure includes a first memory region 700, a second memory region 710, a third memory region 780, a fourth memory region 790, a read operation block 720, and a write operation block 740.

A plurality of cells (not shown) are disposed in an array in the first memory region 700.

A plurality of cells (not shown) are disposed in an array in the second memory region 710. The data stored in the second memory region 710 is data which is generated by copying the data stored in the first memory region 700 in a mirrored fashion.

A plurality of cells (not shown) are disposed in an array in the third memory region 780. The data stored in the third memory region 780 is data which is generated by copying the data stored in the first memory region 700 in a mirrored fashion.

A plurality of cells (not shown) are disposed in an array in the fourth memory region 790. The data stored in the fourth memory region 790 is data which is generated by copying the data stored in the first memory region 700 in a mirrored fashion.

That is to say, the plurality of cells disposed in the first memory region 700 to the fourth memory region 790 are completely the same in terms of type and size. Therefore, the first memory region 700 to the fourth memory region 790 are different in terms of only the address RD_BA for selecting the memory region but are completely the same in terms of the address RD_A for accessing the cells disposed therein. For example, when addresses RD_BA and RD_A for selecting the cell disposed on the third word line and the seventh bit line of the first memory region 700 are composed as RD_BA=1 and RD_A=3 7, addresses RD_BA and RD_A for selecting the cell disposed on the third word line and the seventh bit line of the second memory region 710 will be composed as RD_BA=2 and RD_A=3 7. Furthermore, addresses RD_BA and RD_A for selecting the cell disposed on the third word line and the seventh bit line of the third memory region 780 will be composed as RD_BA=3 and RD_A=3 7, and addresses RD_BA and RD_A for selecting the cell disposed on the third word line and the seventh bit line of the fourth memory region 790 will be composed as RD_BA=4 and RD_A=3 7. In this way, the first memory region 700 to the fourth memory region 790 are set in such a manner that data with the same value is stored in respective cell at the same position therein.

A plurality of other memory regions which are not directly shown in the drawing may be provided in the semiconductor memory device in addition to the first memory region 700 to the fourth memory region 790, and in this case, the plurality of cells disposed in the plurality of other memory regions may be the same as those disposed in the first to fourth memory regions 700, 710, 780 and 790 in terms of type and size. In other words, not only the first memory region 700 to the fourth memory region 790 but also the plurality of memory regions, which are included in the semiconductor memory device, may be set in such a manner that they are different in terms of only the address RD_BA for selecting a memory region but are the same in terms of the address RD_A for accessing the cells disposed therein. Thus, the addresses RD_BA and RD_A inputted to the semiconductor memory device may be divided into a region selection address RD_BA for selecting a memory region and a cell selection address RD_A for selecting a unit cell which is included in each memory region.

In the case where any one memory region among the first memory region 700 to the fourth memory region 790 is repeatedly selected when a read operation is performed two or more times, the read operation block 720 sequentially selects the first memory region 700 to the fourth memory region 790 and reads data from a selected memory region 700, 710, 780 or 790. Namely, in the case where the value of the region selection address RD_BA between input addresses RD_BA and RD_A indicates any one memory region among the first memory region 700 to the fourth memory region 790 when a read operation is performed two or more times, the read operation block 720 sequentially selects the first memory region 700 to the fourth memory region 790 and reads data from a selected memory region 700, 710, 780 or 790.

For example, when a read operation is performed six times, the region selection address RD_BA which indicates the first memory region 700 may be inputted in first to fourth read operations while the region selection address RD_BA which indicates the third memory region 780 may be inputted in fifth to sixth read operations. In such a read operation performed six times, the read operation block 720 selects the first memory region 700 in correspondence to the first read operation, and selects and reads the data stored therein, based on the value of the cell selection address RD_A. The read operation block 720 selects the second memory region 710 in correspondence to the second read operation, and selects and reads the data stored therein, based on the value of the cell selection address RD_A. The read operation block 720 selects the third memory region 780 in correspondence to the third read operation, and selects and reads the data stored therein, based on the value of the cell selection address RD_A. The read operation block 720 selects the fourth memory region 790 in correspondence to the fourth read operation, and selects and reads the data stored therein, based on the value of the cell selection address RD_A. The read operation block 720 selects again the first memory region 700 in correspondence to the fifth read operation, and selects and reads the data stored therein, based on the value of the cell selection address RD_A. The read operation block 720 selects again the second memory region 710 in correspondence to the sixth read operation, and selects and reads the data stored therein, based on the value of the cell selection address RD_A.

In this way, in the case where the region selection address RD_BA for selecting any one memory region among the first memory region 700 to the fourth memory region 790 is inputted when a read operation is performed two or more times, the read operation block 720 sequentially selects the first memory region 700 to the fourth memory region 790 regardless of the value of the region selection address RD_BA, and selects and reads the data stored in a selected memory region, based on the value of the cell selection address RD_A. The reason why such an operation is possible is that the first memory region 700 to the fourth memory region 790 store data in a mirrored fashion with respect to one another.

In the case where any one memory region among the first memory region 700 to the fourth memory region 790 is selected in a write operation, the write operation block 740 duplicately stores input data in the first memory region 700 to the fourth memory region 790. That is to say, the write operation block 740 operates in the write operation in such a manner that input data may be stored in the first memory region 700 to the fourth memory region 790 in a mirrored fashion.

As may be readily seen from the above descriptions, the operations of the first memory region 700 to the fourth memory region 790 are controlled in common by the read operation block 720 and the write operation block 740. Of course, the first memory region 700 to the fourth memory region 790 may input/output data completely independent of one another as usual. In other words, the first memory region 700 inputs/outputs data through a first local line LIO1. Also, the second memory region 710 inputs/outputs data through a second local line LIO2. Moreover, the third memory region 780 inputs/outputs data through a third local line LIO3. Further, the fourth memory region 790 inputs/outputs data through a fourth local line LIO4. The first local line LIO1 to the fourth local line LIO4 use a global line GIO in common. Accordingly, the data of the first memory region 700 is inputted/outputted from and to the exterior through the global line GIO along with the first local line LIO1. Also, the data of the second memory region 710 is inputted/outputted from and to the exterior through the global line GIO along with the second local line LIO2. Moreover, the data of the third memory region 780 is inputted/outputted from and to the exterior through the global line GIO along with the third local line LIO3. Further, the data of the fourth memory region 790 is inputted/outputted from and to the exterior through the global line GIO along with the fourth local line LIO4.

The above described configuration of the semiconductor memory device wherein the operations of the first memory region 700 to the fourth memory region 790 are controlled in common may be adopted only in a specified mode. For example, in a high speed operation mode, as described above in the present embodiment, the operations of the first memory region 700 to the fourth memory region 790 are controlled in common, and data is stored in a mirrored fashion with respect to one another. However, in a normal operation mode other than the high speed operation mode, the first memory region 700 to the fourth memory region 790 are controlled completely independent of one another, and the data stored is not related. Namely, in the normal operation mode, the read operation block 720 reads data stored in a memory region selected in a read operation. The read operation block 720 reads the data stored in the first memory region 700 when the first memory region 700 is selected in a read operation, reads the data stored in the second memory region 710 when the second memory region 710 is selected in a read operation, reads the data stored in the third memory region 780 when the third memory region 780 is selected in a read operation, and reads the data stored in the fourth memory region 790 when the fourth memory region 790 is selected in a read operation. Similarly, in the normal operation mode, the write operation block 740 stores input data in a memory region selected in a write operation. The write operation block 740 stores input data in the first memory region 700 when the first memory region 700 is selected in a write operation, stores input data in the second memory region 710 when the second memory region 710 is selected in a write operation, stores input data in the third memory region 780 when the third memory region 780 is selected in a write operation, and stores input data in the fourth memory region 790 when the fourth memory region 790 is selected in a write operation.

Figure 8:
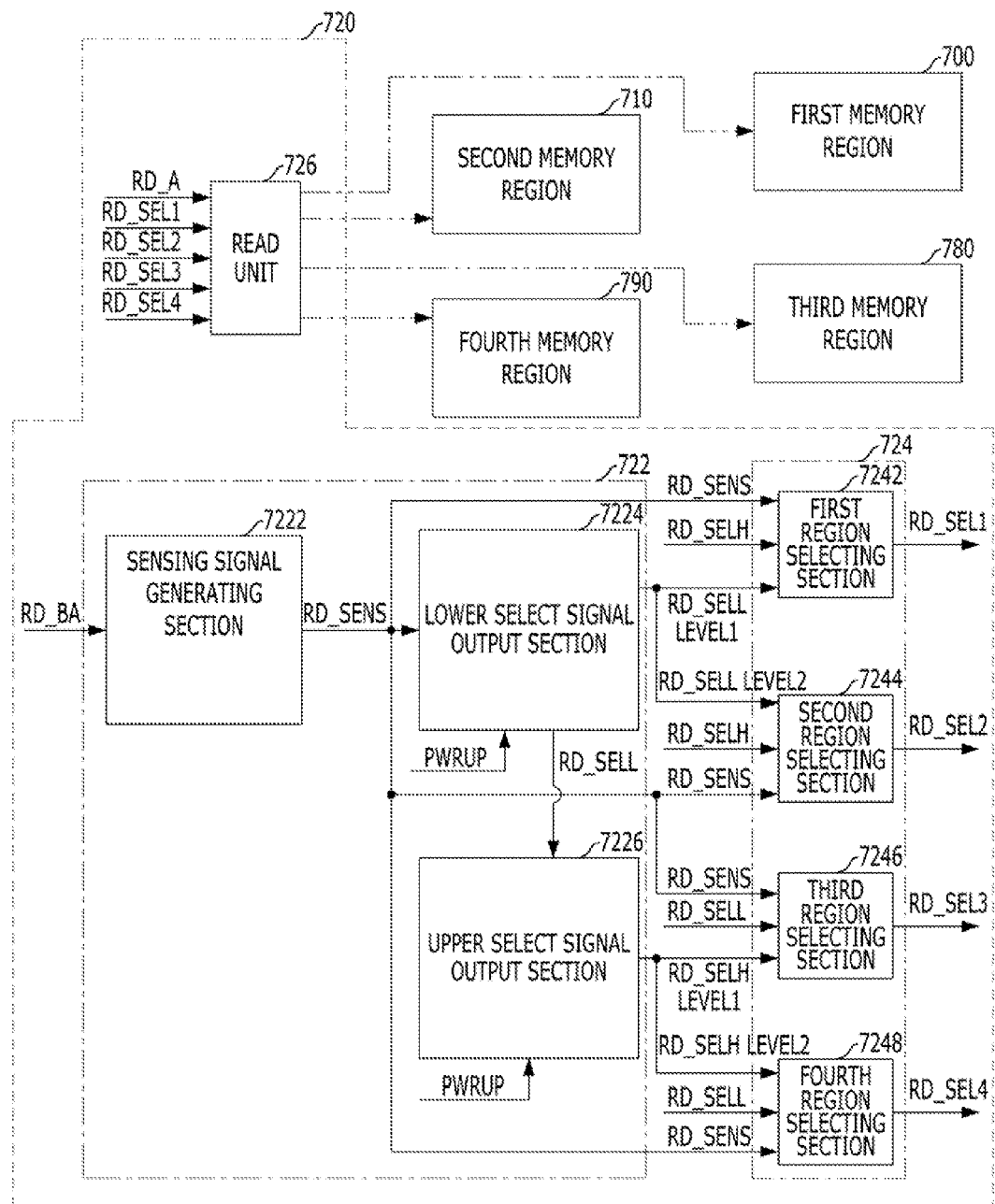
FIG. 8 is a diagram showing in detail a read operation block among the component elements of the semiconductor memory device in accordance with the second embodiment of the present disclosure shown in FIG. 7.

FIG. 8 is a diagram showing in detail the read operation block among the component elements of the semiconductor memory device in accordance with the second embodiment of the present disclosure shown in FIG. 7.

Referring to FIG. 8, the read operation block 720 among the component elements of the semiconductor memory device in accordance with the second embodiment of the present disclosure includes an address sensing unit 722, a selection unit 724, and a read unit 726. The address sensing unit 722 includes a sensing signal generating section 7222, a lower select signal output section 7224, and an upper select signal output section 7226. Further, the selection unit 724 includes a first region selecting section 7242, a second region selecting section 7244, a third region selecting section 7246, and a fourth region selecting section 7248.

The address sensing unit 722 shifts the logic levels of select signals RD_SELL and RD_SELH each time it is sensed that the region selection address RD_BA indicates any one memory region among the first memory region 700 to the fourth memory region 790 in the read operation.

The sensing signal generating section 7222 toggles/pulses a sensing signal RD_SENS each time it is sensed that the region selection address RD_BA indicates any one memory region among the first memory region 700 to the fourth memory region 790 in the read operation.

The lower select signal output section 7224 initializes the lower select signal RD_SELL to a first logic level LEVEL1 in response to a power-up signal PWRUP. Also, after the initialization, the lower select signal output section 7224 shifts the lower select signal RD_SELL to a second logic level LEVEL2 in response to odd-numbered toggling of the sensing signal RD_SENS. Further, after the initialization, the lower select signal output section 7224 shifts the lower select signal RD_SELL to the first logic level LEVEL1 in response to even-numbered toggling of the sensing signal RD_SENS.

The upper select signal output section 7226 initializes the upper select signal RD_SELH to a first logic level LEVEL1 in response to the power-up signal PWRUP. Also, after the initialization, the upper select signal output section 7226 shifts the upper select signal RD_SELH to a second logic level LEVEL2 in response to odd-numbered toggling of the lower select signal RD_SELL. Further, after the initialization, the upper select signal output section 7226 shifts the upper select signal RD_SELH to the first logic level LEVEL1 in response to even-numbered toggling of the lower select signal RD_SELL.

When the upper select signal RD_SELH is in the first logic level, the selection unit 724 selects the first memory region 700 in the first logic level period of the lower select signal RD_SELL, and selects the second memory region 710 in the second logic level period of the lower select signal RD_SELL. When the upper select signal RD_SELH is in the second logic level, the selection unit 724 selects the third memory region 780 in the first logic level period of the lower select signal RD_SELL, and selects the fourth memory region 790 in the second logic level period of the lower select signal RD_SELL.

The first region selecting section 7242 toggles a first select signal RD_SEL1 for selecting the first memory region 700, in response to the toggling of the sensing signal RD_SENS, when the lower and upper select signals RD_SELL and RD_SELH are in the first logic level.

The second region selecting section 7244 toggles a second select signal RD_SEL2 for selecting the second memory region 710, in response to the toggling of the sensing signal RD_SENS, when the lower and upper select signals RD_SELL and RD_SELH are in the second logic level and the first logic level, respectively.

The third region selecting section 7246 toggles a third select signal RD_SEL3 for selecting the third memory region 780, in response to the toggling of the sensing signal RD_SENS, when the lower and upper select signals RD_SELL and RD_SELH are in the first logic level and the second logic level, respectively.

The fourth region selecting section 7248 toggles a fourth select signal RD_SEL4 for selecting the fourth memory region 790, in response to the toggling of the sensing signal RD_SENS, when the lower and upper select signals RD_SELL and RD_SELH are in the second logic level.

The read unit 726 reads the data stored in a memory cell which is designated by the cell selection address RD_A, among the plurality of memory cells (not shown) included in the memory region 700, 710, 780 or 790 selected by the selection unit 724.

In detail, the read unit 726 reads the data stored in a memory cell which is designated by the cell selection address RD_A, among the plurality of memory cells (not shown) included in the first memory region 700, in response to the toggling of the first select signal RD_SEL1. Also, the read unit 726 reads the data stored in a memory cell which is designated by the cell selection address RD_A, among the plurality of memory cells (not shown) included in the second memory region 710, in response to the toggling of the second select signal RD_SEL2. Moreover, the read unit 726 reads the data stored in a memory cell which is designated by the cell selection address RD_A, among the plurality of memory cells (not shown) included in the third memory region 780, in response to the toggling of the third select signal RD_SEL3. Further, the read unit 726 reads the data stored in a memory cell which is designated by the cell selection address RD_A, among the plurality of memory cells (not shown) included in the fourth memory region 790, in response to the toggling of the fourth select signal RD_SEL4.

Figure 9:
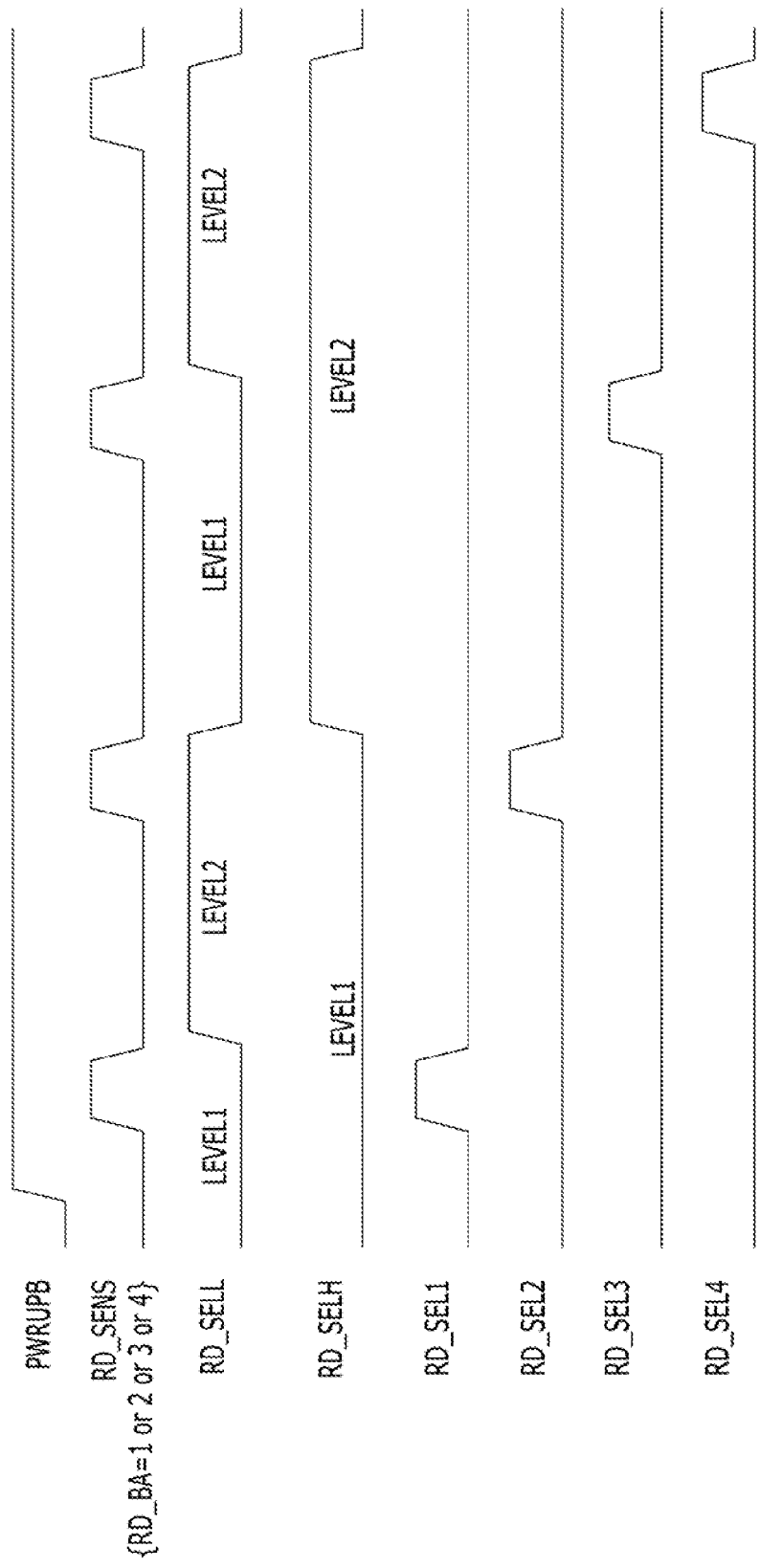
FIG. 9 is a timing diagram explaining the operation of the read operation block in accordance with the second embodiment of the present disclosure shown in FIG. 8.

FIG. 9 is a timing diagram explaining the operation of the read operation block in accordance with the second embodiment of the present disclosure shown in FIG. 8.

Referring to FIG. 9, the operation of the read operation block 720 in accordance with the second embodiment of the present disclosure is started as the lower select signal RD_SELL and the upper select signal RD_SELH are set to the first logic level LEVEL1 in response to the power-up signal PWRUP. That is to say, the operation of the read operation block 720 is started as the lower select signal RD_SELL and the upper select signal RD_SELH are set to the first logic level LEVEL1 in response to a signal PWRUPB that is generated by inverting the phase of the power-up signal PWRUP and transitions from a logic low to a logic high.

After the initial operation, if it is sensed that the region selection address RD_BA among the addresses (not shown) inputted from the exterior has the value of '1' designating the first memory region 700, the value of '2' designating the second memory region 710, the value of '3' designating the third memory region 780 or the value of '4' designating the fourth memory region 790, the sensing signal RD_SENS toggles. For example, as in the drawing, each time the region selection address RD_BA has the value of '1', '2', '3' or '4', the sensing signal RD_SENS toggles to a logic high in the state in which the logic level of the sensing signal RD_SENS is basically set to a logic low.

After the lower select signal RD_SELL and the upper select signal RD_SELH are initialized to the first logic level LEVEL1 by the power-up signal PWRUP, the lower select signal RD_SELL transitions to the second logic level LEVEL2 in response to the sensing signal RD_SENS toggling first. Then, the lower select signal RD_SELL transitions again to the first logic level LEVEL1 in response to the sensing signal RD_SENS toggling second. Since the lower select signal RD_SELL performs a toggling operation when the lower select signal RD_SELL transitions again to the first logic level LEVEL1, the upper select signal RD_SELH transitions to the second logic level LEVEL2. Namely, in response to the second toggling of the sensing signal RD_SENS, the lower select signal RD_SELL transitions to the first logic level LEVEL1 and the upper select signal RD_SELH transitions to the second logic level LEVEL2.

Furthermore, the lower select signal RD_SELL transitions again to the second logic level LEVEL2 in response to the sensing signal RD_SENS toggling third. Then, the lower select signal RD_SELL transitions again to the first logic level LEVEL1 in response to the sensing signal RD_SENS toggling fourth. Since the lower select signal RD_SELL performs another toggling operation when the lower select signal RD_SELL transitions again to the first logic level LEVEL1, the upper select signal RD_SELH transitions to the first logic level LEVEL1. Namely, in response to the fourth toggling of the sensing signal RD_SENS, the lower select signal RD_SELL transitions to the first logic level LEVEL1 and the upper select signal RD_SELH transitions to the first logic level LEVEL1.

In this way, after being initialized to the first logic level LEVEL1, the lower select signal RD_SELL repeatedly transitions between the second logic level LEVEL2 and the first logic level LEVEL1 each time the sensing signal RD_SENS toggles. Also, after being initialized to the first logic level LEVEL1, the upper select signal RD_SELH repeatedly transitions between the second logic level LEVEL2 and the first logic level LEVEL1 each time the lower select signal RD_SELL toggles.

For reference, while it may be seen in the drawing that the first logic level LEVEL1 means a logic low and the second logic level LEVEL2 means a logic high, this is only an example and the opposite setting is possible.

Meanwhile, the transition time of the lower select signal RD_SELL is set to correspond to a time when the toggling of the sensing signal RD_SENS is completed. In other words, the lower select signal RD_SELL retains a previous logic level at a time when the toggling of the sensing signal RD_SENS starts and transitions in response to the completion of the toggling. Also, the transition time of the upper select signal RD_SELH is set to correspond to a time when the toggling of the lower select signal RD_SELL is completed. In other words, the upper select signal RD_SELH retains a previous logic level at a time when the toggling of the lower select signal RD_SELL starts and transitions in response to the completion of the toggling. This is to ensure that the toggling of the sensing signal RD_SENS is transferred thoroughly to the toggling of the first select signal RD_SEL1, the toggling of the second select signal RD_SEL2, the toggling of the third select signal RD_SEL3 or the toggling of the fourth select signal RD_SEL4.

Therefore, after the lower select signal RD_SELL and the upper select signal RD_SELH are initialized to the first logic level LEVEL1 by the power-up signal PWRUP, the sensing signal RD_SENS makes the first toggling in the state in which the lower select signal RD_SELL and the upper select signal RD_SELH have thoroughly transferred the first logic level LEVEL1. In this way, due to the fact that the first toggling of the sensing signal RD_SENS is implemented in the state in which the lower select signal RD_SELL and the upper select signal RD_SELH have the first logic level LEVEL1, the first select signal RD_SEL1 toggles, but the second to fourth select signals RD_SEL2, RD_SEL3 and RD_SEL4 do not toggle. Namely, the first memory region 700 is selected, and the data stored therein is selectively read based on the value of the cell selection address RD_A. However, the second to fourth memory regions 710, 780 and 790 are not selected, and the data stored therein is not read regardless of the cell selection address RD_A.

Similarly, the second toggling of the sensing signal RD_SENS is implemented in the state in which the lower select signal RD_SELL has thoroughly transferred the second logic level LEVEL2 and the upper select signal RD_SELH has thoroughly transferred the first logic level LEVEL1. In this way, the second select signal RD_SEL2 toggles, but the first, third and fourth select signals RD_SEL1, RD_SEL3 and RD_SEL4 do not toggle. Namely, the second memory region 710 is selected, and the data stored therein is selectively read based on the value of the cell selection address RD_A. However, the first, third and fourth memory regions 700, 780 and 790 are not selected, and the data stored therein are not read regardless of the cell selection address RD_A.

Moreover, the third toggling of the sensing signal RD_SENS is implemented in the state in which the lower select signal RD_SELL has thoroughly transferred the first logic level LEVEL1 and the upper select signal RD_SELH has thoroughly transferred the second logic level LEVEL2. In this way, the third select signal RD_SEL3 toggles, but the first, second and fourth select signals RD_SEL1, RD_SEL2 and RD_SEL4 do not toggle. Namely, the third memory region 780 is selected, and the data stored therein is selectively read based on the value of the cell selection address RD_A. However, the first, second and fourth memory regions 700, 710 and 790 are not selected, and the data stored therein is not read regardless of the cell selection address RD_A.

Further, the fourth toggling of the sensing signal RD_SENS is implemented in the state in which the lower select signal RD_SELL and the upper select signal RD_SELH have thoroughly transferred the second logic level LEVEL2. In this way, the fourth select signal RD_SEL4 toggles, but the first, second and third select signals RD_SEL1, RD_SEL2 and RD_SEL3 do not toggle. Namely, the fourth memory region 790 is selected, and the data stored therein is selectively read based on the value of the cell selection address RD_A. However, the first, second and third memory regions 700, 710 and 780 are not selected, and the data stored therein is not read regardless of the cell selection address RD_A.

Summarizing this, after the initialization, the first to fourth select signals RD_SEL1, RD_SEL2, RD_SEL3 and RD_SEL4 successively toggle in response to the toggling of the sensing signal RD_SENS by a multiple of 4, and the first to fourth memory regions 700, 710, 780 and 790 are successively selected and the data stored therein is read.

Figure 10:
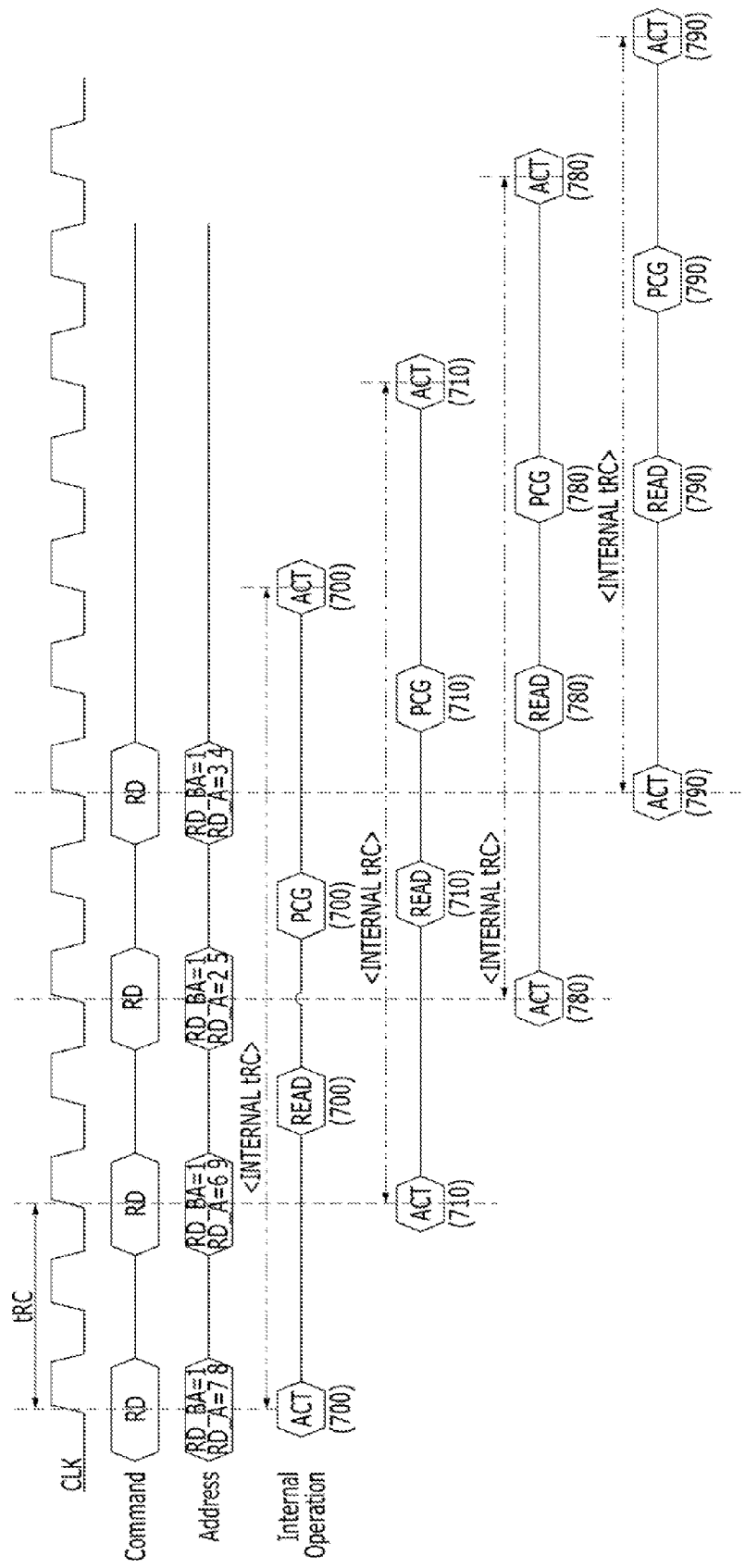
FIG. 10 is a timing diagram explaining the read operation of the semiconductor memory device in accordance with the second embodiment of the present disclosure shown in FIGS. 7 to 9.

FIG. 10 is a timing diagram explaining the read operation of the semiconductor memory device in accordance with the second embodiment of the present disclosure shown in FIGS. 7 to 9.

Referring to FIG. 10, it may be seen that, in the semiconductor memory device in accordance with the second embodiment of the present disclosure, a minimum time tRC required between successive read operations is shortened to ¼ when compared to the conventional semiconductor memory device shown in FIG. 1. "Command", "RD", "Address", and "Internal operation" shown in FIG. 6 denote "a command signal", "a read command signal", "an address signal", and "an internal operation sequence", respectively.

When describing this in detail, it may be seen from the drawing that, when a read operation is successively repeated four times, the respective read operations are successively performed at the interval of 2 cycles (2 ck) of a clock signal CLK. It may be seen that, when considering that 8 cycles (8 ck) of the clock signal CLK is required between the successive read operations in the conventional semiconductor memory device shown in FIG. 1, the interval of 2 cycles (2 ck) of the clock signal CLK corresponds to ¼.

In particular, in the input addresses RD_BA and RD_A corresponding to the first read operation, the region selection address RD_BA has the value of '1' and the cell selection address RD_A has the value of '7 8'. In the input addresses RD_BA and RD_A corresponding to the second read operation, the region selection address RD_BA has the value of '1' and the cell selection address RD_A has the value of '6 9'. In the input addresses RD_BA and RD_A corresponding to the third read operation, the region selection address RD_BA has the value of '1' and the cell selection address RD_A has the value of '2 5'. In the input addresses RD_BA and RD_A corresponding to the fourth read operation, the region selection address RD_BA has the value of '1' and the cell selection address RD_A has the value of '3 4'. In this way, the input addresses RD_BA and RD_A in all the four read operations have the region selection address RD_BA with the value of '1'. That is to say, in the same manner in all the four read operations, the region selection address RD_BA is inputted to select the first memory region 700. Therefore, the four read operations are to be successively performed for only the first memory region 700 at the interval of 2 cycles (2 ck) of the clock signal CLK. In this regard, in the conventional semiconductor memory device shown in FIG. 1, since a physical limitation exists in that the minimum time tRC corresponds to 8 cycles (8 ck) of the clock signal CLK, the four successive read operations as shown in FIG. 10 may not be properly performed.

However, in the semiconductor memory device in accordance with the second embodiment of the present disclosure, the data stored in the first memory region 700 is stored in the second to fourth memory regions 710, 780 and 790 in a mirrored fashion, and the first memory region 700 to the fourth memory region 790 are successively selected internally, regardless of the fact that the region selection address RD_BA is inputted to select the first memory region 700 in the same manner in all the four read operations. Therefore, in the semiconductor memory device in accordance with the second embodiment of the present disclosure, the successive four read operations as shown in FIG. 10 may be properly performed, while each of the first memory region 700 to the fourth memory region 790 are provided with a read operation time INTERNAL tRC for the basic cycle of the read operation, which may correspond to 8 cycles (8 ck) of the clock signal CLK.

Summarizing this, in the semiconductor memory device in accordance with the second embodiment of the present disclosure, in the case where the same memory region is repeatedly selected in a read operation which is performed two or more times, the memory region may be selected alternately with other memory regions storing the same data as the memory region. Hence, in FIG. 10, although the region selection address RD_BA is inputted to select the first memory region 700 in all the four read operations which are repeatedly performed, the first to fourth memory regions 700 to 790 are selected in the first to fourth read operations, respectively. Therefore, the read operation time corresponding to 8 cycles (8 ck) of the clock signal CLK is ensured for each of the read operations.

In other words, in the first read operation which is performed in the first memory region 700, the cell disposed on the seventh word line and the eighth bit line in the first memory region 700 is selected and the data stored therein is read through stepwise operations of active (ACT), read (READ) and precharge (PCG) for a read operation time corresponding to 8 cycles (8 ck) of the clock signal CLK. Thus, the first read operation may be performed without a problem.

Further, in the second read operation that is performed in the second memory region 710, the cell disposed on the sixth word line and the ninth bit line in the second memory region 710 is selected and the data stored therein is read through stepwise operations of active (ACT), read (READ) and precharge (PCG) for a read operation time corresponding to 8 cycles (8 ck) of the clock signal CLK. Thus, the second read operation may be performed without a problem.

Moreover, in the third read operation which is performed in the third memory region 780, the cell disposed on the second word line and the fifth bit line in the third memory region 780 is selected and the data stored therein is read through stepwise operations of active (ACT), read (READ) and precharge (PCG) for a read operation time corresponding to 8 cycles (8 ck) of the clock signal CLK. Thus, the third read operation may be performed without a problem.

The operation periods of the first read operation, the second read operation and the third read operation overlap with one another. In spite of this fact, the reason why the first read operation, the second read operation and the third read operation may be performed without a problem resides in that the first to third read operations are performed in the first to third memory regions 700 to 780, respectively.

Furthermore, in the fourth read operation which is performed in the fourth memory region 790, the cell disposed on the third word line and the fourth bit line in the fourth memory region 790 is selected and the data stored therein is read through stepwise operations of active (ACT), read (READ) and precharge (PCG) for a read operation time corresponding to 8 cycles (8 ck) of the clock signal CLK. Thus, the fourth read operation may be performed without a problem.

The operation periods of the second read operation, the third read operation and the fourth read operation overlap with one another. In spite of this fact, the reason why the second read operation, the third read operation and the fourth read operation may be performed without problem resides in that the second to fourth read operations are performed in the second to fourth memory regions 710 to 790, respectively.

In this second embodiment, this is how the data of the first memory region 700 is stored in the second to fourth memory regions 710, 780 and 790 in a mirrored fashion. Therefore, when repeatedly accessing the first memory region 700 and reading data therefrom, an operation for repeatedly accessing the second memory region 710 and reading data therefrom, an operation for repeatedly accessing the third memory region 780 and reading data therefrom or an operation for repeatedly accessing the fourth memory region 790 and reading data therefrom, the read operation may be properly performed in such a way that the semiconductor memory device internally and alternately selects the first memory region 700 to the fourth memory region 790. Through this, even in the case where an operation for reading data in the first memory region 700, the second memory region 710, the third memory region 780, or the fourth memory region 790 is repeated at high speed, the read operation may be properly performed without a problem.

Third Embodiment

Figure 11:
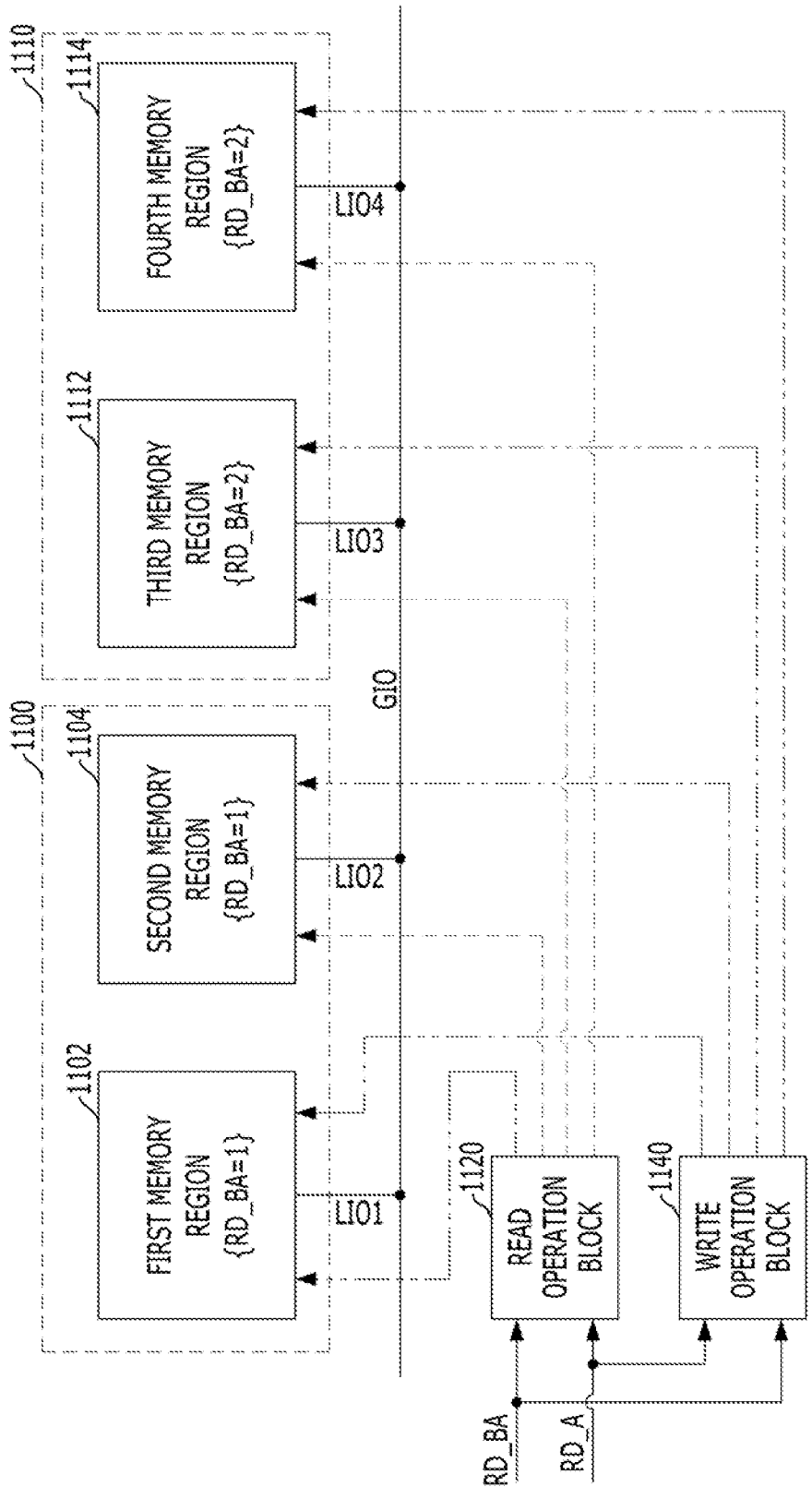
FIG. 11 is a diagram explaining the concept of read/write operations of a semiconductor memory device in accordance with a third embodiment of the present disclosure.

FIG. 11 is a diagram explaining the concept of read/write operations of a semiconductor memory device in accordance with a third embodiment of the present disclosure.

Referring to FIG. 11, the semiconductor memory device in accordance with the third embodiment of the present disclosure includes a first storage block 1100, a second storage block 1110, a read operation block 1120, and a write operation block 1140. The first storage block 1100 includes a first memory region 1102 and a second memory region 1104. The second storage block 1110 includes a third memory region 1112 and a fourth memory region 1114.

A plurality of cells (not shown) are disposed in an array in the first memory region 1102. A plurality of cells (not shown) are disposed in an array in the second memory region 1104. The data stored in the second memory region 1104 is data which is generated by copying the data stored in the first memory region 1102 in a mirrored fashion.

A plurality of cells (not shown) are disposed in an array in the third memory region 1112. A plurality of cells (not shown) are disposed in an array in the fourth memory region 1114. The data stored in the fourth memory region 1114 is data which is generated by copying the data stored in the third memory region 1112 in a mirrored fashion.

The data stored in the first storage block 1100 and the data stored in the second storage block 1110 is completely different. That is to say, the data stored in the first memory region 1102 and the second memory region 1104 and the data stored in the third memory region 1112 and the fourth memory region 1114 is completely different.

Accordingly, the cells disposed in the first memory region 1102 are completely the same as those of the second memory region 1104 in terms of type and size. Input addresses RD_BA and RD_A for selecting the first memory region 1102 and the second memory region 1104 are completely the same. In other words, the first memory region 1102 and the second memory region 1104 are only internally distinguished from each other to store data in a mirrored fashion, and are handled as one memory region being the first storage block 1100, when viewed from the exterior. Therefore, the first memory region 1102 and the second memory region 1104 may not be selectively accessed. For example, when input addresses RD_BA and RD_A are composed as RD_BA=1 and RD_A=3 7, the cell disposed on the third word line and the seventh bit line of the first memory region 1102 may be selected, and the cell disposed on the third word line and the seventh bit line of the second memory region 1104 may be selected.

Similarly, the cells disposed in the third memory region 1112 are completely the same as those of the fourth memory region 1114 in terms of type and size. Input addresses RD_BA and RD_A for selecting the third memory region 1112 and the fourth memory region 1114 are completely the same. In other words, the third memory region 1112 and the fourth memory region 1114 are only internally distinguished from each other to store data in a mirrored fashion and are handled as one memory region being the second storage block 1110, when viewed from the exterior. Therefore, the third memory region 1112 and the fourth memory region 1114 may not be selectively accessed. For example, when input addresses RD_BA and RD_A are composed as RD_BA=2 and RD_A=3 7, the cell disposed on the third word line and the seventh bit line of the third memory region 1112 may be selected, and the cell disposed on the third word line and the seventh bit line of the fourth memory region 1114 may be selected.

For reference, a plurality of storage blocks or a plurality of memory regions which are not directly shown in the drawing may be provided in the semiconductor memory device in addition to the first storage block 1100 and the second storage block 1110.

In the case in which the first storage block 1100 is repeatedly selected when a read operation is performed two or more times, the read operation block 1120 repeatedly and alternately selects the first memory region 1102 and the second memory region 1104 and reads data from a selected memory region 1102 or 1104. Namely, in the case where the value of the region selection address RD_BA between input addresses RD_BA and RD_A indicates the first storage block 1100 when a read operation is performed two or more times, the read operation block 1120 repeatedly and alternately selects the first memory region 1102 and the second memory region 1104 and reads data from a selected memory region 1102 or 1104.

Also, in the case in which the second storage block 1110 is repeatedly selected when a read operation is performed two or more times, the read operation block 1120 repeatedly and alternately selects the third memory region 1112 and the fourth memory region 1114 and reads data from a selected memory region 1112 or 1114. Namely, in the case in which the value of the region selection address RD_BA between input addresses RD_BA and RD_A indicates the second storage block 1110 when a read operation is performed two or more times, the read operation block 1120 repeatedly and alternately selects the third memory region 1112 and the fourth memory region 1114 and reads data from a selected memory region 1112 or 1114.

For example, when a read operation is performed six times, the region selection address RD_BA which indicates the first storage block 1100 may be inputted in first to third read operations while the region selection address RD_BA which indicates the second storage block 1110 may be inputted in fourth to sixth read operations. In such a read operation performed six times, the read operation block 1120 selects the first memory region 1102 in correspondence to the first read operation, and selects and reads the data stored therein, based on the value of the cell selection address RD_A. The read operation block 1120 selects the second memory region 1104 in correspondence to the second read operation, and selects and reads the data stored therein, based on the value of the cell selection address RD_A. The read operation block 1120 selects again the first memory region 1102 in correspondence to the third read operation, and selects and reads the data stored therein, based on the value of the cell selection address RD_A. The read operation block 1120 selects the third memory region 1112 in correspondence to the fourth read operation, and selects and reads the data stored therein, based on the value of the cell selection address RD_A. The read operation block 1120 selects the fourth memory region 1114 in correspondence to the fifth read operation, and selects and reads the data stored therein, based on the value of the cell selection address RD_A. The read operation block 1120 selects again the third memory region 1112 in correspondence to the sixth read operation, and selects and reads the data stored therein, based on the value of the cell selection address RD_A.

In this way, in the case where the region selection address RD_BA for selecting the first storage block 1100 is inputted when a read operation is performed two or more times, the read operation block 1120 repeatedly and alternately selects the first memory region 1102 and the second memory region 1104 regardless of the value of the region selection address RD_BA, and selects and reads the data stored in a selected memory region, based on the value of the cell selection address RD_A. The reason why such an operation is possible is that the first memory region 1102 and the second memory region 1104 store data in a mirrored fashion with respect to each other.

Also, in the case in which the region selection address RD_BA for selecting the second storage block 1110 is inputted when a read operation is performed two or more times, the read operation block 1120 repeatedly and alternately selects the third memory region 1112 and the fourth memory region 1114 regardless of the value of the region selection address RD_BA, and selects and reads the data stored in a selected memory region, based on the value of the cell selection address RD_A. The reason why such an operation is possible is that the third memory region 1112 and the fourth memory region 1114 store data in a mirrored fashion with respect to each other.

In the case in which the first storage block 1100 is selected in a write operation, the write operation block 1140 duplicately stores input data in the first memory region 1102 and the second memory region 1104. That is to say, the write operation block 1140 operates in such a manner that input data may be stored in the first memory region 1102 and the second memory region 1104 in a mirrored fashion.

Also, when the second storage block 1110 is selected in a write operation, the write operation block 1140 duplicately stores input data in the third memory region 1112 and the fourth memory region 1114. That is to say, the write operation block 1140 operates in such a manner that input data may be stored in the third memory region 1112 and the fourth memory region 1114 in a mirrored fashion.

As may be readily seen from the above descriptions, by the read operation block 1120 and the write operation block 1140, the operations of the first memory region 1102 and the second memory region 1104 are controlled in common and the operations of the third memory region 1112 and the fourth memory region 1114 are controlled in common. The first memory region 1102 and the second memory region 1104 may input/output data completely independently of each other as usual. Similarly, the third memory region 1112 and the fourth memory region 1114 may input/output data completely independently of each other. In other words, the first memory region 1102 inputs/outputs data through a first local line LIO1. Also, the second memory region 1104 inputs/outputs data through a second local line LIO2 and the third memory region 1112 inputs/outputs data through a third local line LIO3. Further, the fourth memory region 1114 inputs/outputs data through a fourth local line LIO4. The first local line LIO1 to the fourth local line LIO4 use a global line GIO in common. Accordingly, the data of the first memory region 1102 is inputted/outputted from and to the exterior through the global line GIO along with the first local line LIO1. Also, the data of the second memory region 1104 is inputted/outputted from and to the exterior through the global line GIO along with the second local line LIO2. Moreover, the data of the third memory region 1112 is inputted/outputted from and to the exterior through the global line GIO along with the third local line LIO3. Further, the data of the fourth memory region 1114 is inputted/outputted from and to the exterior through the global line GIO along with the fourth local line LIO4.

Figure 12:
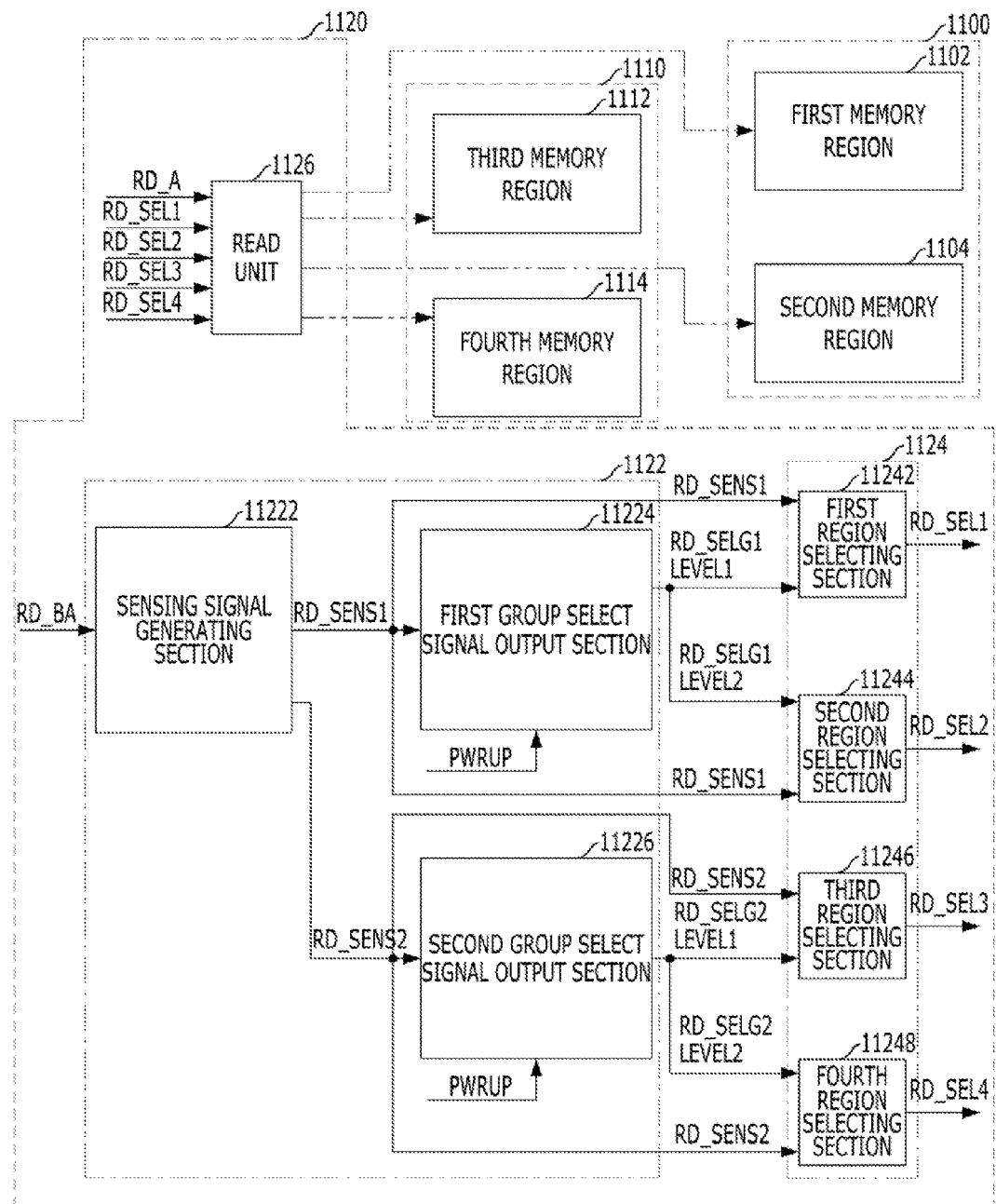
FIG. 12 is a diagram showing in detail a read operation block among the component elements of the semiconductor memory device in accordance with the third embodiment of the present disclosure shown in FIG. 11.

FIG. 12 is a diagram showing in detail the read operation block among the component elements of the semiconductor memory device in accordance with the third embodiment of the present disclosure shown in FIG. 11.

Referring to FIG. 12, the read operation block 1120 among the component elements of the semiconductor memory device in accordance with the third embodiment of the present disclosure includes an address sensing unit 1122, a selection unit 1124, and a read unit 1126. The address sensing unit 1122 includes a sensing signal generating section 11222, a first group select signal output section 11224, and a second group select signal output section 11226. Further, the selection unit 1124 includes a first region selecting section 11242, a second region selecting section 11244, a third region selecting section 11246, and a fourth region selecting section 11248.

The address sensing unit 1122 shifts the logic level of a first group select signal RD_SELG1 each time it is sensed that the region selection address RD_BA indicates the first storage block 1100 in the read operation. Also, the address sensing unit 1122 shifts the logic level of a second group select signal RD_SELG2 each time it is sensed that the region selection address RD_BA indicates the second storage block 1110 in the read operation.

The sensing signal generating section 11222 toggles/pulses a first sensing signal RD_SENS1 each time it is sensed that the region selection address RD_BA indicates the first storage block 1100 in the read operation. Also, the sensing signal generating section 11222 toggles a second sensing signal RD_SENS2 each time it is sensed that the region selection address RD_BA indicates the second storage block 1110 in the read operation.

The first group select signal output section 11224 initializes the first group select signal RD_SELG1 to a first logic level LEVEL1 in response to a power-up signal PWRUP. Also, after the initialization, the first group select signal output section 11224 shifts the first group select signal RD_SELG1 to a second logic level LEVEL2 in response to odd-numbered toggling of the first sensing signal RD_SENS1. Further, after the initialization, the first group select signal output section 11224 shifts the first group select signal RD_SELG1 to the first logic level LEVEL1 in response to even-numbered toggling of the first sensing signal RD_SENS1.

The second group select signal output section 11226 initializes the second group select signal RD_SELG2 to a first logic level LEVEL1 in response to the power-up signal PWRUP. Also, after the initialization, the second group select signal output section 11226 shifts the second group select signal RD_SELG2 to a second logic level LEVEL2 in response to odd-numbered toggling of the second sensing signal RD_SENS2. Further, after the initialization, the second group select signal output section 11226 shifts the second group select signal RD_SELG2 to the first logic level LEVEL1 in response to even-numbered toggling of the second sensing signal RD_SENS2.

When the first sensing signal RD_SENS1 toggles, the selection unit 1124 selects the first memory region 1102 in the first logic level period of the first group select signal RD_SELG1, and selects the second memory region 1104 in the second logic level period of the first group select signal RD_SELG1. When the second sensing signal RD_SENS2 toggles, the selection unit 1124 selects the third memory region 1112 in the first logic level period of the second group select signal RD_SELG2, and selects the fourth memory region 1114 in the second logic level period of the second group select signal RD_SELG2.

The first region selecting section 11242 toggles a first select signal RD_SEL1 for selecting the first memory region 1102, in response to the toggling of the first sensing signal RD_SENS1 in the first logic level period of the first group select signal RD_SELG1.

The second region selecting section 11244 toggles a second select signal RD_SEL2 for selecting the second memory region 1104, in response to the toggling of the first sensing signal RD_SENS1 in the second logic level period of the first group select signal RD_SELG1.

The third region selecting section 11246 toggles a third select signal RD_SEL3 for selecting the third memory region 1112, in response to the toggling of the second sensing signal RD_SENS2 in the first logic level period of the second group select signal RD_SELG2.

The fourth region selecting section 11248 toggles a fourth select signal RD_SEL4 for selecting the fourth memory region 1114, in response to the toggling of the second sensing signal RD_SENS2 in the second logic level period of the second group select signal RD_SELG2.

The read unit 1126 reads the data stored in a memory cell which is designated by the cell selection address RD_A, among the plurality of memory cells (not shown) included in the memory region 1102, 1104, 1112 or 1114 selected by the selection unit 1124.

In detail, the read unit 1126 reads the data stored in a memory cell which is designated by the cell selection address RD_A, among the plurality of memory cells (not shown) included in the first memory region 1102, in response to the toggling of the first select signal RD_SEL1. Also, the read unit 1126 reads the data stored in a memory cell which is designated by the cell selection address RD_A, among the plurality of memory cells (not shown) included in the second memory region 1104, in response to the toggling of the second select signal RD_SEL2. Moreover, the read unit 1126 reads the data stored in a memory cell which is designated by the cell selection address RD_A, among the plurality of memory cells (not shown) included in the third memory region 1112, in response to the toggling of the third select signal RD_SEL3. Further, the read unit 1126 reads the data stored in a memory cell which is designated by the cell selection address RD_A, among the plurality of memory cells (not shown) included in the fourth memory region 1114, in response to the toggling of the fourth select signal RD_SEL4.

Figure 13:
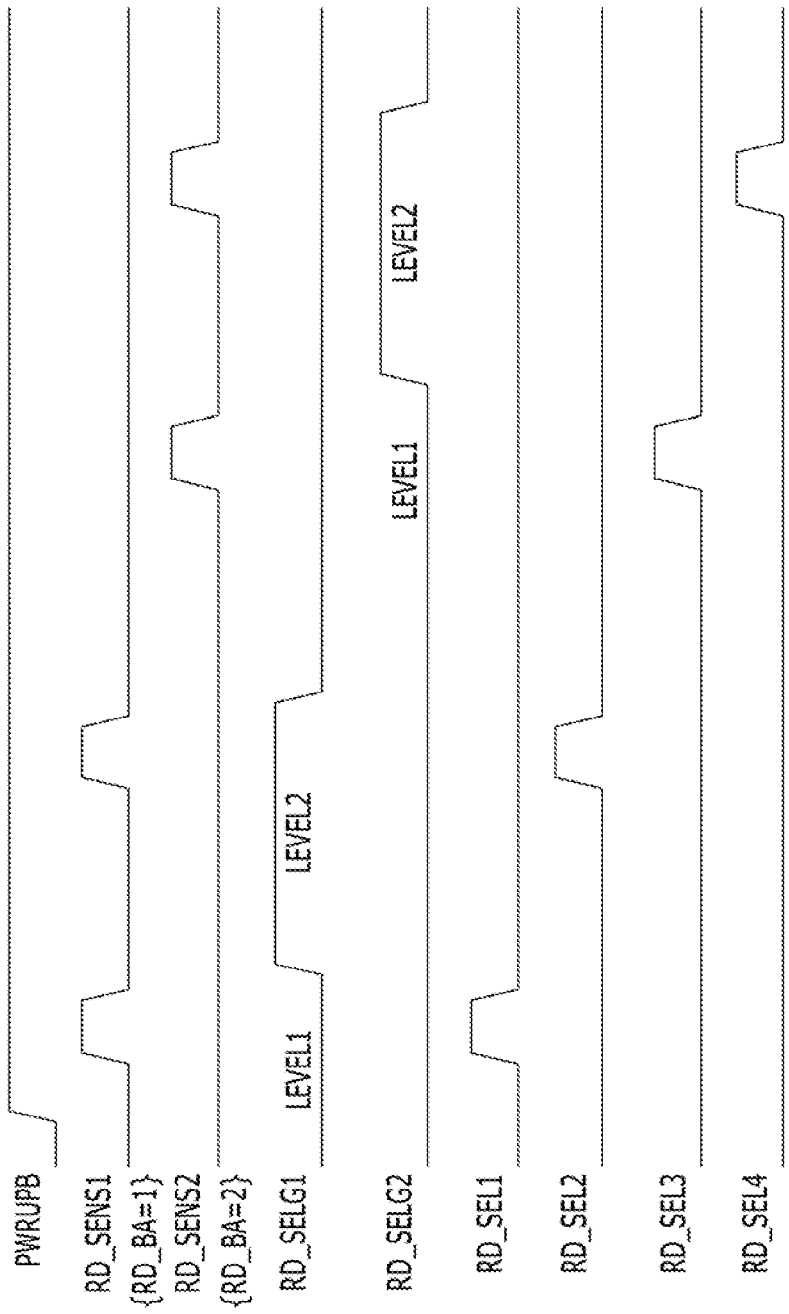
FIG. 13 is a timing diagram explaining the operation of the read operation block in accordance with the third embodiment of the present disclosure shown in FIG. 12.

FIG. 13 is a timing diagram explaining the operation of the read operation block in accordance with the third embodiment of the present disclosure shown in FIG. 12.

Referring to FIG. 13, the operation of the read operation block 1120 in accordance with the third embodiment of the present disclosure is started as the first group select signal RD_SELG1 and the second group select signal RD_SELG2 are set to the first logic level LEVEL1 in response to the power-up signal PWRUP. That is to say, the operation of the read operation block 1120 is started as the first group select signal RD_SELG1 and the second group select signal RD_SELG2 are set to the first logic level LEVEL1 in response to a signal PWRUPB that is generated by inverting the phase of the power-up signal PWRUP and transitions from a logic low to a logic high.

After the initial operation, if it is sensed that the region selection address RD_BA among the addresses (not shown) inputted from the exterior has the value of '1' designating the first storage block 1100, the first sensing signal RD_SENS1 toggles. For example, as in the drawing, each time the region selection address RD_BA has the value of '1', the first sensing signal RD_SENS1 toggles to a logic high in the state in which the logic level of the first sensing signal RD_SENS1 is basically set to a logic low.

After the initial operation, if it is sensed that the region selection address RD_BA among the addresses (not shown) inputted from the exterior has the value of '2' designating the second storage block 1110, the second sensing signal RD_SENS2 toggles. For example, as in the drawing, each time the region selection address RD_BA has the value of '2', the second sensing signal RD_SENS2 toggles to a logic high in the state in which the logic level of the second sensing signal RD_SENS2 is basically set to a logic low.

After the first group select signal RD_SELG1 is initialized to the first logic level LEVEL1 by the power-up signal PWRUP, the first group select signal RD_SELG1 transitions to the second logic level LEVEL2 in response to the first sensing signal RD_SENS1 toggling first. Then, the first group select signal RD_SELG1 transitions again to the first logic level LEVEL1 in response to the first sensing signal RD_SENS1 toggling second.

After the second group select signal RD_SELG2 is initialized to the first logic level LEVEL1 by the power-up signal PWRUP, the second group select signal RD_SELG2 transitions to the second logic level LEVEL2 in response to the second sensing signal RD_SENS2 toggling first. Then, the second group select signal RD_SELG2 transitions again to the first logic level LEVEL1 in response to the second sensing signal RD_SENS2 toggling second.

In this way, after being initialized to the first logic level LEVEL1, the first group select signal RD_SELG1 repeatedly transitions between the second logic level LEVEL2 and the first logic level LEVEL1 each time the first sensing signal RD_SENS1 toggles. Also, after being initialized to the first logic level LEVEL1, the second group select signal RD_SELG2 repeatedly transitions between the second logic level LEVEL2 and the first logic level LEVEL1 each time the second sensing signal RD_SENS2 toggles.

For reference, while it may be seen in the drawing that the first logic level LEVEL1 means a logic low and the second logic level LEVEL2 means a logic high, this is only an example and opposite setting is also possible.

The transition time of the first group select signal RD_SELG1 is set to correspond to when the toggling of the first sensing signal RD_SENS1 is completed. In other words, the first group select signal RD_SELG1 retains a previous logic level at a time when the toggling of the first sensing signal RD_SENS1 starts and transitions in response to the completion of the toggling. This is to ensure that the toggling of the first sensing signal RD_SENS1 is transferred thoroughly to the toggling of the first select signal RD_SEL1 or the toggling of the second select signal RD_SEL2.

Also, the transition time of the second group select signal RD_SELG2 is set to correspond to when the toggling of the second sensing signal RD_SENS2 is completed. In other words, the second group select signal RD_SELG2 retains a previous logic level at a time when the toggling of the second sensing signal RD_SENS2 starts and transitions in response to the completion of the toggling. This is to ensure that the toggling of the second sensing signal RD_SENS2 is transferred thoroughly to the toggling of the third select signal RD_SEL3 or the toggling of the fourth select signal RD_SEL4.

Therefore, after the first group select signal RD_SELG1 is initialized to the first logic level LEVEL1 by the power-up signal PWRUP, the first sensing signal RD_SENS1 makes the first toggling in a state in which the first group select signal RD_SELG1 has thoroughly transferred the first logic level LEVEL1. In this way, due to the fact that the first toggling of the first sensing signal RD_SENS1 is implemented in the state in which the first group select signal RD_SELG1 has the first logic level LEVEL1, the first select signal RD_SEL1 toggles, but the second select signal RD_SEL2 does not toggle. Namely, the first memory region 1102 is selected, and the data stored therein is selectively read based on the value of the cell selection address RD_A. However, the second memory region 1104 is not selected, and the data stored therein is not read regardless of the cell selection address RD_A.

Similarly, the second toggling of the first sensing signal RD_SENS1 is implemented in the state in which the first group select signal RD_SELG1 has thoroughly transferred the second logic level LEVEL2. In this way, the second select signal RD_SEL2 toggles, but the first select signal RD_SEL1 does not toggle. Namely, the second memory region 1104 is selected, and the data stored therein is selectively read based on the value of the cell selection address RD_A. However, the first memory region 1102 is not selected, and the data stored therein is not read regardless of the cell selection address RD_A.

Further, after the second group select signal RD_SELG2 is initialized to the first logic level LEVEL1 by the power-up signal PWRUP, the second sensing signal RD_SENS2 makes the first toggling in the state in which the second group select signal RD_SELG2 has thoroughly transferred the first logic level LEVEL1. In this way, due to the fact that the first toggling of the second sensing signal RD_SENS2 is implemented in the state in which the second group select signal RD_SELG2 has the first logic level LEVEL1, the third select signal RD_SEL3 toggles, but the fourth select signal RD_SEL4 does not toggle. Namely, the third memory region 1112 is selected, and the data stored therein is selectively read based on the value of the cell selection address RD_A. However, the fourth memory region 1114 is not selected, and the data stored therein is not read regardless of the cell selection address RD_A.

Similarly, the second toggling of the second sensing signal RD_SENS2 is implemented in the state in which the second group select signal RD_SELG2 has thoroughly transferred the second logic level LEVEL2. In this way, the fourth select signal RD_SEL4 toggles, but the third select signal RD_SEL3 does not toggle. Namely, the fourth memory region 1114 is selected, and the data stored therein is selectively read based on the value of the cell selection address RD_A. However, the third memory region 1112 is not selected, and the data stored therein is not read regardless of the cell selection address RD_A.

Summarizing this, after the initialization, the first select signal RD_SEL1 toggles in response to the odd-numbered toggling of the first sensing signal RD_SENS1, and the first memory regions 1102 is selected and the data stored therein is read. Conversely, after the initialization, the second select signal RD_SEL2 toggles in response to the even-numbered toggling of the first sensing signal RD_SENS1, and the second memory regions 1104 is selected and the data stored therein is read.

Also, after the initialization, the third select signal RD_SEL3 toggles in response to the odd-numbered toggling of the second sensing signal RD_SENS2, and the third memory regions 1112 is selected and the data stored therein is read. Conversely, after the initialization, the fourth select signal RD_SEL4 toggles in response to the even-numbered toggling of the second sensing signal RD_SENS2, and the fourth memory regions 1114 is selected and the data stored therein is read.

In this way, in the semiconductor memory device to which the third embodiment of the present disclosure is applied, the first memory region 1102 and the second memory region 1104, which belong to the first storage block 1100, store data in a mirrored fashion with respect to each other. Therefore, in the case of an operation for repeatedly accessing the first storage block 1100 and reading data therefrom, the read operation may be properly performed in such a way that the semiconductor memory device internally and alternately selects the first memory region 1102 and the second memory region 1104. Through this, even in the case in which an operation for reading data in the first storage block 1100 is repeated at a high speed, the read operation may be properly performed without problem.

Further, the third memory region 1112 and the fourth memory region 1114, which belong to the second storage block 1110, store data in a mirrored fashion with respect to each other. Therefore, in the case of an operation for repeatedly accessing the second storage block 1110 and reading data therefrom, the read operation may be properly performed in such a way that the semiconductor memory device internally and alternately selects the third memory region 1112 and the fourth memory region 1114. Through this, even in the case where an operation for reading data in the second storage block 1110 is repeated at high speed, the read operation may be properly performed without a problem.

As is apparent from the above descriptions, the technology according to the present disclosure uses a second memory region for storing the data of a first memory region in a mirrored fashion. Therefore, in the case in which an operation for repeatedly accessing the first memory region and reading data therefrom is to be performed or an operation for repeatedly accessing the second memory region and reading data therefrom is to be performed, a read operation may be properly performed in such a way that a semiconductor memory device internally and alternately selects the first memory region and the second memory region. Through this method, when reading data in the first memory or second memory region at high speed, the read operation may be performed without a problem.

Although various embodiments have been described for illustrative purposes, it will be apparent to those skilled in the art that various changes and modifications may be made without departing from the spirit and scope of the invention as defined in the following claims.

For instance, positions and kinds of logic gates and transistors exemplified in the above-described embodiment may be differently realized depending on the polarities of the signals inputted thereto.

What is claimed is:

1. A semiconductor memory device comprising:
   first and second memory regions suitable for storing data in a mirrored fashion with respect to each other during a high speed operation period; and
   a read operation block suitable for alternately selecting the first and second memory regions and reading data from a selected memory region, when the first or second memory region is repeatedly selected in read operations performed two or more times during the high speed operation period.

2. The semiconductor memory device according to claim 1, further comprising:
   a write operation block suitable for duplicately storing input data in the first and second memory regions, when the first or second memory region is selected in a write operation during the high speed operation period.

3. The semiconductor memory device according to claim 2, wherein the first and second memory regions store respective data during a normal operation period, while the first and second memory regions store duplicate data in respective cells at a same position therein during the high speed operation.

4. The semiconductor memory device according to claim 3, wherein the first memory region and the second memory region input/output data through first and second local lines that are separated and connected to the first memory region and the second memory region, respectively, and
   wherein the first and second local lines are connected to a global line in common and respectively input/output the data.

5. The semiconductor memory device according to claim 1, wherein the read operation block comprises:
   an address sensing unit suitable for shifting a logic level of a select signal each time a region selection address is sensed to designate the first or second memory region in a read operation;
   a selection unit suitable for selecting the first memory region in a first logic level period of the select signal and selecting the second memory region in a second logic level period of the select signal; and
   a read unit suitable for reading data stored in a memory cell which is designated by a remaining address excluding the region selection address, among a plurality of memory cells included in a memory region selected by the selection unit.

6. The semiconductor memory device according to claim 5, wherein the address sensing unit comprises:
   a sensing signal generating section suitable for toggling a sensing signal each time the region selection address is sensed to designate the first or second memory region in the read operation; and
   a select signal output section suitable for initializing the select signal to a first logic level in response to a power-up signal, shifting the select signal to a second logic level in response to odd-numbered toggling of the sensing signal after initialization, and shifting the select signal to the first logic level in response to even-numbered toggling of the sensing signal after the initialization.

7. The semiconductor memory device according to claim 6, wherein the selection unit comprises:
- a first region selecting section suitable for toggling a first select signal for selecting the first memory region, in response to toggling of the sensing signal in the first logic level period of the select signal; and
- a second region selecting section suitable for toggling a second select signal for selecting the second memory region, in response to toggling of the sensing signal in the second logic level period of the select signal.

8. The semiconductor memory device according to claim 7, wherein the read unit reads data stored in a memory cell which is designated by the remaining address excluding the region selection address, among a plurality of memory cells included in the first memory region, in response to toggling of the first select signal, and
wherein the read unit reads data stored in a memory cell which is designated by the remaining address excluding the region selection address, among a plurality of memory cells included in the second memory region, in response to toggling of the second select signal.

9. The semiconductor memory device according to claim 2, wherein the write operation block selects the first and second memory regions in response to a region selection address designating the first or second memory region in the write operation, and duplicately stores input data in memory cells, which are designated by a remaining address excluding the region selection address, respectively included in the first and second memory regions.

10. The semiconductor memory device according to claim 3, wherein the read operation block reads data stored in the first memory region when the first memory region is selected and reads data stored in the second memory region when the second memory region is selected, in a read operation during the normal operation period.

11. The semiconductor memory device according to claim 10, wherein the write operation block stores input data in the first memory region when the first memory region is selected and stores input data in the second memory region when the second memory region is selected, in a write operation during the normal operation period.

12. A semiconductor memory device comprising:
- a first storage block including a first memory region and a second memory region, which stores mirrored data from the first memory region;
- a second storage block including a third memory region and a fourth memory region, which stores mirrored data from the third memory region; and
- a read operation block suitable for alternately selecting the first and second memory regions when the first storage block is repeatedly selected in read operations performed two or more times, alternately selecting the third and fourth memory regions when the second storage block is repeatedly selected in the read operations performed two or more times, and reading data from a selected memory region.

13. The semiconductor memory device according to claim 12, further comprising:
- a write operation block suitable for duplicately storing input data in the first and second memory regions when the first storage block is selected in a write operation, and duplicately storing the input data in the third and fourth memory regions when the second storage block is selected in the write operation.

14. The semiconductor memory device according to claim 13, wherein the first to fourth memory regions input/output data through first to fourth local lines which are connected thereto respectively and separate from one another, and
wherein the first to fourth local lines are connected to a global line in common and respectively input/output the data.

15. The semiconductor memory device according to claim 12, wherein the read operation block comprises:
- an address sensing unit suitable for shifting a logic level of a first group select signal each time a region selection address is sensed to designate the first storage block in a read operation, and shifting a logic level of a second group select signal each time the region selection address is sensed to designate the second storage block in the read operation;
- a selection unit suitable for selecting the first memory region in a first logic level period of the first group select signal and selecting the second memory region in a second logic level period of the first group select signal, when the region selection address is sensed to designate the first storage block, and select the third memory region in a first logic level period of the second group select signal and select the fourth memory region in a second logic level period of the second group select signal, when the region selection address is sensed to designate the second storage block; and
- a read unit suitable for reading data stored in a memory cell that is designated by a remaining address excluding the region selection address, among a plurality of memory cells included in a memory region selected by the selection unit.

16. The semiconductor memory device according to claim 15, wherein the address sensing unit comprises:
- a sensing signal generating section suitable for toggling a first sensing signal each time the region selection address is sensed to designate the first storage block in the read operation, and toggling a second sensing signal each time the region selection address is sensed to designate the second storage block in the read operation;
- a first group select signal output section initialized in response to a power-up signal, and suitable for shifting the first group select signal to a second logic level in response to odd-numbered toggling of the first sensing signal after initialization, and shifting the first group select signal to a first logic level in response to even-numbered toggling of the first sensing signal after the initialization; and
- a second group select signal output section initialized in response to the power-up signal, and suitable for shifting the second group select signal to a second logic level in response to odd-numbered toggling of the second sensing signal after initialization, and shifting the second group select signal to a first logic level in response to even-numbered toggling of the second sensing signal after the initialization.

17. The semiconductor memory device according to claim 16, wherein the selection unit comprises:
- a first region selecting section suitable for toggling a first select signal for selecting the first memory region, in response to toggling of the first sensing signal in the first logic level period of the first group select signal;
- a second region selecting section suitable for toggling a second select signal for selecting the second memory region, in response to toggling of the first sensing signal in the second logic level period of the first group select signal;

a third region selecting section suitable for toggling a third select signal for selecting the third memory region, in response to toggling of the second sensing signal in the first logic level period of the second group select signal; and a fourth region selecting section suitable for toggling a fourth select signal for selecting the fourth memory region, in response to toggling of the second sensing signal in the second logic level period of the second group select signal.

18. The semiconductor memory device according to claim 17, wherein the read unit reads data stored in a memory cell which is designated by the remaining address excluding the region selection address, among a plurality of memory cells included in the first memory region, in response to toggling of the first select signal, wherein the read unit reads data stored in a memory cell which is designated by the remaining address excluding the region selection address, among a plurality of memory cells included in the second memory region, in response to toggling of the second select signal, wherein the read unit reads data stored in a memory cell which is designated by the remaining address excluding the region selection address, among a plurality of memory cells included in the third memory region, in response to toggling of the third select signal, and wherein the read unit reads data stored in a memory cell which is designated by the remaining address excluding the region selection address, among a plurality of memory cells included in the fourth memory region, in response to toggling of the fourth select signal.

19. The semiconductor memory device according to claim 13, wherein the write operation block selects the first and second memory regions in response to a region selection address of input addresses designating the first storage block in the write operation, and duplicately stores input data in memory cells, which are designated by a remaining address excluding the region selection address, respectively included in the first and second memory regions, and wherein the write operation block selects the third and fourth memory regions in response to the region selection address of the input addresses designating the second storage block in the write operation, and duplicately stores input data in memory cells, which are designated by the remaining address excluding the region selection address, respectively included in the third and fourth memory regions.

20. A semiconductor memory device comprising:

first and second memory regions suitable for storing respective data;

a write operation block suitable for storing duplicate data in the first memory region and the second memory region at a same position therein during a high speed operation period; and a read operation block suitable for alternately reading the duplicate data from the first and second memory regions during the high speed operation period.

* * * * *